(12) United States Patent
Rhee et al.

(10) Patent No.: US 12,178,107 B2
(45) Date of Patent: Dec. 24, 2024

(54) ELECTRONIC DEVICE COMPRISING DISPLAY

(71) Applicant: Samsung Electronics Co., Ltd., Suwon-si (KR)

(72) Inventors: Bong Jae Rhee, Suwon-si (KR); Ji Hoon Park, Suwon-si (KR); Ji Hun Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 950 days.

(21) Appl. No.: 16/760,502

(22) PCT Filed: Oct. 26, 2018

(86) PCT No.: PCT/KR2018/012832
§ 371 (c)(1),
(2) Date: Nov. 19, 2021

(87) PCT Pub. No.: WO2019/088594
PCT Pub. Date: May 9, 2019

(65) Prior Publication Data
US 2022/0223661 A1   Jul. 14, 2022

(30) Foreign Application Priority Data
Oct. 30, 2017  (KR) .................. 10-2017-0142842

(51) Int. Cl.
*H10K 59/65* (2023.01)
*G06V 40/13* (2022.01)
(Continued)

(52) U.S. Cl.
CPC ......... *H10K 59/65* (2023.02); *G06V 40/1318* (2022.01); *H10K 50/865* (2023.02); *H10K 50/868* (2023.02); *H10K 59/12* (2023.02)

(58) Field of Classification Search
CPC .... H10K 59/65; H10K 50/865; H10K 50/868; H10K 59/12; H10K 50/86; H10K 59/126; H10K 59/40; H10K 71/00; G06V 40/1318
See application file for complete search history.

(56) References Cited

U.S. PATENT DOCUMENTS 8,053,963 B2   11/2011   Kim et al.
8,344,396 B2   1/2013    Shim et al.
(Continued)

FOREIGN PATENT DOCUMENTS

JP  2011107321 A  *  6/2011
KR  10-0732983 B1    6/2007
(Continued)

OTHER PUBLICATIONS

Notice of Preliminary Rejection dated Jul. 8, 2022 in connection with Korean Patent Application No. 10-2017-0142842, 12 pages.
(Continued)

*Primary Examiner* — S M Sohel Imtiaz

(57) ABSTRACT

An electronic device according to one embodiment may include: a transparency layer; a pixel layer disposed under the transparency layer, and including pixels that emit light in a visible ray and for displaying a content through the transparency layer; a display panel disposed under the pixel layer, and including a substrate layer including switches operating the pixels; a bio-sensor disposed under the display panel, and enabling acquisition of biometric information by using reflected light obtained through reflection, by an external object, of light output through the pixels; and a coating reflecting external light in an infrared ray band transmitted to the substrate layer, and allowing transmission
(Continued)

of the light in a visible ray band, wherein the coating is formed between the transparency layer and the display panel.

10 Claims, 13 Drawing Sheets

(51) Int. Cl.
*H10K 50/80* (2023.01)
*H10K 50/86* (2023.01)
*H10K 59/12* (2023.01)

(56) References Cited

U.S. PATENT DOCUMENTS

| | | | |
|---|---|---|---|
| 8,976,322 B2 | 3/2015 | Kim et al. | |
| 9,806,295 B2 | 10/2017 | Kim et al. | |
| 2010/0134893 A1* | 6/2010 | Kim | H05K 9/0096 |
| | | | 361/818 |
| 2016/0155789 A1* | 6/2016 | Kim | H10K 50/86 |
| | | | 257/40 |
| 2016/0181573 A1* | 6/2016 | Xia | G02B 5/3016 |
| | | | 359/483.01 |
| 2017/0213066 A1* | 7/2017 | Hsieh | H10K 59/65 |
| 2017/0372113 A1* | 12/2017 | Zhang | H10K 50/854 |
| 2018/0173343 A1* | 6/2018 | Pi | G06F 3/041 |
| 2019/0156097 A1* | 5/2019 | Liu | H10K 59/65 |

FOREIGN PATENT DOCUMENTS

| | | |
|---|---|---|
| KR | 10-0937964 B1 | 1/2010 |
| KR | 10-2012-0013654 A | 2/2012 |
| KR | 10-2012-0015942 A | 2/2012 |
| KR | 10-2016-0065267 A | 6/2016 |
| WO | 2016/205832 A1 | 12/2016 |

OTHER PUBLICATIONS

Notice of Patent Grant dated Dec. 28, 2022 in connection with Korean Patent Application No. 10-2017-0142842, 4 pages.
International Search Report dated Apr. 11, 2019 in connection with International Patent Application No. PCT/KR2018/012832, 3 pages.
Written Opinion of the International Searching Authority dated Apr. 11, 2019 in connection with International Patent Application No. PCT/KR2018/012832, 6 pages.

* cited by examiner

ELECTRONIC DEVICE COMPRISING DISPLAY

CROSS-REFERENCE TO RELATED APPLICATIONS

This application is a 371 of International Application No. PCT/KR2018/012832 filed on Oct. 26, 2018, which claims priority to Korean Patent Application No. 10-2017-0142842 filed on Oct. 30, 2017, the disclosures of which are herein incorporated by reference in their entirety.

1. FIELD

Various embodiments of the disclosure relate to an electronic device for improving screen quality.

2. DESCRIPTION OF RELATED ART

Electronic devices are being provided in various forms such as a smart phone, a tablet Personal Computer (PC), and a Personal Digital Assistant (PDA), according to the development of digital technologies. Electronic devices are also being developed in a user wearable form in order to improve portability and a user's accessibility.

Electronic devices may include a display and may also be provided in a form of having a reduced bezel region around the display since a larger screen is preferred. In the outdoors with strong light or in a brightly lit space, the light reflected from the screen may be brighter than the image displayed on the display, and the image on the display may be dark and thus it may be difficult to accurately recognize the image. Accordingly, measures are being taken to ensure outdoor visibility that makes the display clear under natural light.

A display may include a semiconductor element that serves as a kind of switch for controlling pixels. When sunlight enters the display, a photoelectric effect in which the semiconductor element absorbs light to generate photons occurs, which may cause leakage current from the semiconductor element. The leakage current from the semiconductor element, which responds to sunlight, causes a voltage drop across the pixels and hence an illuminance of the display decreases, which may degrade outdoor visibility. In some cases, there may be a difference between light reflectivities of respective regions of a display. Due to this, the leakage current may not be constant in the regions of the display, and the display may have deteriorated image quality due to difficulty in emitting light having a substantially uniform illuminance over the entire screen.

An embodiment of the disclosure is capable of providing an electronic device including a display for improving luminance decrease of a display by reducing electrical influence of external light on the display.

Various embodiments of the disclosure are capable of providing an electronic device including a display configured to have a substantially uniform light reflectivity over the entire region thereof so that a luminance change due to the electrical influence of external light is uniform throughout the screen.

SUMMARY

An electronic device according to an embodiment of the disclosure may include: a transparent layer; a display panel disposed under the transparent layer, and including a pixel layer including a plurality of pixels configured to output light in a visible light band for displaying a content through the transparent layer, and a substrate layer disposed under the pixel layer and including a plurality of switches capable of driving the plurality of pixels; a biometric sensor disposed under at least part of the display panel, the biometric sensor being configured to acquire biometric information using at least some of reflected light obtained when at least some of light output through at least some of the plurality of pixels is reflected from an external object; and a coating configured to reflect external light in an infrared band, transmitted to the substrate layer, and to transmit light in the visible light band. The coating may be formed between the transparent layer and the display panel.

An electronic device according to an embodiment of the disclosure may include: a transparent layer; a display panel disposed under the transparent layer, and including a plurality of pixels configured to output light in a visible light band for displaying a content through the transparent layer; a biometric sensor disposed under at least part of the display panel and configured to acquire biometric information using at least some of reflected light obtained when at least some of light output through at least some of the plurality of pixels is reflected from an external object; and an anti-reflection member configured to prevent reflection of external light introduced through the transparent layer and the display panel. The anti-reflection member may be disposed between the display panel and the biometric sensor.

With an electronic device including a display according to an embodiment, it is possible to improve outdoor visibility of the display by suppressing a luminance decrease of the display, which is caused by a photoelectric effect due to external light such as sunlight. With an electronic device including a display according to some embodiments, the amount of light reflected from lower media coupled to the display and transmitted to the semiconductor device of the display is substantially uniform over the entire region of the display. Thus, it is possible to improve image quality by making a luminance change caused by the electrical influence of reflected light uniform over the entire screen.

DETAILED DESCRIPTION

Figure 1A:
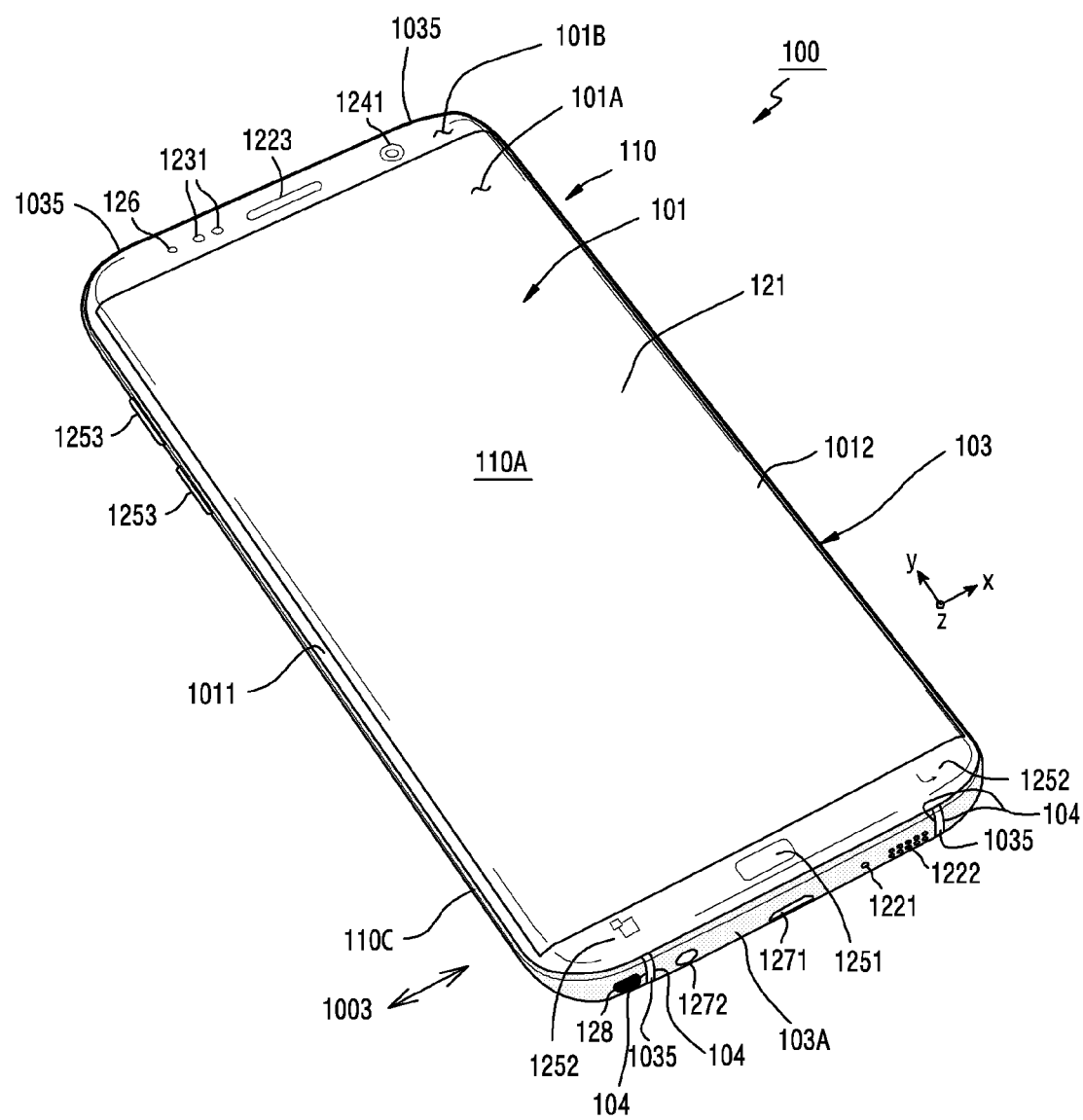
FIG. 1A is a front side perspective view of an electronic device including a display according to an embodiment.

Hereinafter, various embodiments of the disclosure will be described with reference to the accompanying drawings. It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via another element (e.g., third element).

The expression "configured to" used in the disclosure may be interchangeably used with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

An electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

According to various embodiments, the wearable device may include at least one of an accessory type (e.g., watch, ring, bracelet, anklet, necklace, glasses, contact lens, or head-mounted device (HMD)), a fabric or clothing-integrated type (e.g., electronic clothing), a body-mounted type (e.g., skin pad, or tattoo), and a bio-implantable type (e.g., implantable circuit). According to some embodiments, the electronic device may include at least one of, for example, a television, a digital video disk (DVD) player, an audio, a refrigerator, an air conditioner, a vacuum cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to various embodiments, the electronic device may include at least one of various medical devices (e.g., various portable medical measuring devices (blood glucose monitoring device, heart rate monitoring device, blood pressure measuring device, body temperature measuring device, etc.), magnetic resonance angiography (MRA), magnetic resonance imaging (MRI), computed tomography (CT) machine, ultrasonic machine, etc.), a navigation device, a global positioning system (GPS) receiver, an event data recorder (EDR), a flight data recorder (FDR), a vehicle infotainment device, electronic equipment for a ship (e.g., ship navigation device, gyro-compass, etc.), avionics, a security device, an automobile head unit, a home or industrial robot, an automatic teller's machine (ATM) in banks, point of sales (POS) in a shop, or Internet of things devices (e.g., light bulb, various sensors, electric or gas meter, sprinkler device, fire alarm, thermostat, streetlamp, toaster, sporting goods, hot water tank, heater, boiler, etc.). According to some embodiments, the electronic device may include at least one of a part of furniture or a building/structure, an electronic board, an electronic signature receiving device, a projector, and various kinds of measuring instruments (e.g., water meter, electric meter, gas meter, radio wave meter, etc.). In various embodiments, the electronic device may be flexible, or may be a combination of one or more of the aforementioned various devices. The electronic device according to various embodiments of the disclosure is not limited to the aforementioned devices. In the disclosure, the term "user" may refer to a person using an electronic device or a device (e.g., artificial intelligence electronic device) using an electronic device.

Figure 1B:
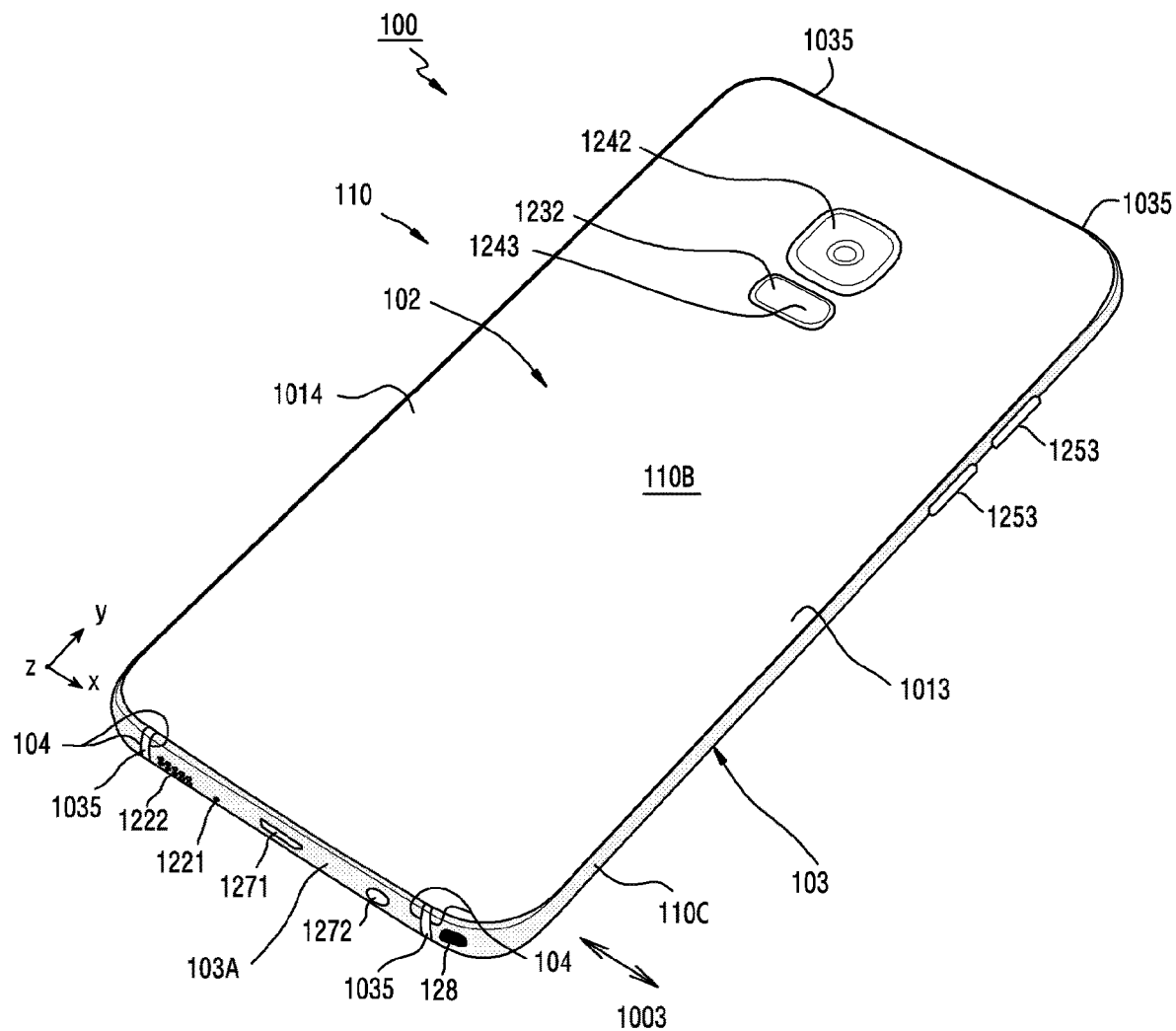
FIG. 1B is a rear side perspective view of an electronic device including a display according to an embodiment.
Figure 2:
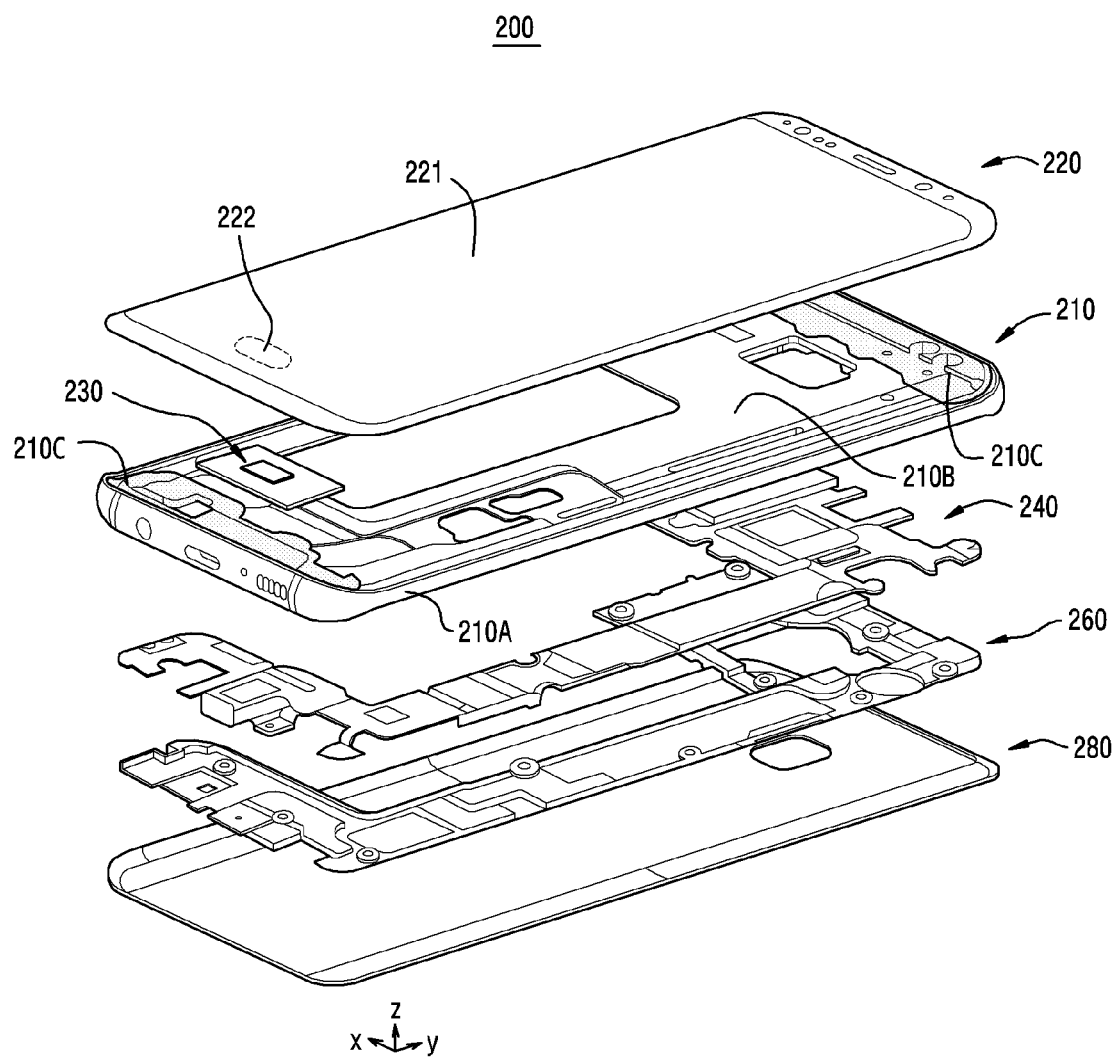
FIG. 2 is an exploded perspective view of an electronic device including a display according to an embodiment.

FIG. 1A is a front side perspective view of an electronic device including a display according to an embodiment. FIG. 1B is a rear side perspective view of an electronic device including a display according to an embodiment. FIG. 2 is an exploded perspective view of an electronic device including a display according to an embodiment.

Referring to FIGS. 1A and 1B, an electronic device 100 according to an embodiment may include a housing 110 that forms all or at least part of the exterior of the electronic device 100. The housing 110 may include a non-metallic material and/or a metallic material. For example, the housing 110 may be formed of materials, such as plastic, metal, carbon fiber and other fiber composites, ceramics, glass, and wood, or a combination thereof. According to various embodiments, the entire housing 110 may be formed of a single material or a combination of multiple materials. According to an embodiment, at least part of the housing 110 is designed to have a metallic material, and may form the exterior of the electronic device 100.

The housing 110 may form the exterior including a front face 110A, a rear face 110B, and a side face 110C surrounding a space between the front face 110A and the rear face 110B. In another embodiment, although not illustrated, the term "housing" may refer to a structure forming at least part of the front face 110A, the rear face 110B, and the side face 110C of the housing 110.

The housing 110 may include a cover or plate (hereinafter, referred to as a "front plate") 101 forming the front face 110A. According to an embodiment, at least part of the front face 110A may be formed by a substantially transparent front plate 101 (e.g., a glass plate or a polymer plate including various coating layers).

The housing 110 may include a cover or plate (hereinafter, referred to as a "rear plate") 102 forming the rear face 110B. According to an embodiment, the rear face 110B may be formed by a substantially opaque rear plate 102. The rear plate 102 may be formed of, for example, coated or colored glass, ceramic, a polymer, or a metal (e.g., aluminum, stainless steel (STS), or magnesium), or a combination of two or more of these materials.

The housing 110 may include a side member (or a side bezel structure) 103 forming the side face 110C. The side member 103 may be in the form of being coupled to the front plate 101 and the rear plate 102 and surrounding the space between the front plate 101 and the back plate 102. At least part of the side member 103 may be formed of various materials such as a metal or a polymer. The side member 103 may include an outer structure 103A formed of a metallic material and an internal structure (not illustrated) formed of a material such as a polymer coupled to the outer structure 103A. According to an embodiment, in order to prevent the radio wave radiation performance of the electronic device 100 from being deteriorated by the side member 103, a portion of the side member 103 may be physically or electrically separated from the remaining portion of the side member 103. The internal structure may allow a portion of the side member 103 to be maintained in the state of being physically or electrically separated from the remaining portion of the side member 130. Some portions 1035 of the inner structure may be disposed in gaps 104 in the outer structure 103A to be exposed to the outside. According to some embodiments, the rear plate 102 and the outer structure 103A may be integrally formed. According to various embodiments, when the rear plate 102 and the outer structure 103A are integrally formed, the rear plate 102 and the outer structure 103A may include the same metallic material.

According to various embodiments, the edge area of the front face 110A or the back face 110B may be formed as an inclined face (e.g., a curved face). For example, at least one of opposite edge regions 1011 and 1012 of the front face 110A in the width direction 1003 or at least one of opposite edge regions 1013 and 1014 of the rear face 110B in the width direction 1003 may be an inclined face. According to an embodiment, the front plate 101 may be formed to have a curved portion for forming an inclined face of the front face 110A. Similarly, the rear plate 102 may be formed to have a curved portion for forming an inclined face of the rear face 110B.

The electronic device 100 may include various components disposed between the front plate 101 and the rear plate 102. According to an embodiment, the electronic device 100 may include at least one of a display 121, audio modules 1221, 1222, and 1223, sensor modules 1231 and 1232, camera modules 1241, 1242, and 1243, key input devices 1251, 1252, and 1253, an indicator 126, connector holes 1271 and 1272, or an electronic pen 128. In some embodiments, in the electronic device 100, at least one of the components (e.g., the key input devices 1251, 1252, and 1253 or the indicator 126) may be omitted, or other components may be additionally included.

The display 121 may be disposed along at least a portion of the front plate 101, and may be exposed through the front plate 101. The front plate 101 may include a region 101A that covers the display 121 (hereinafter, referred to as a "screen region") and a region 101B that does not cover the display 121 (hereinafter, referred to as a "bezel region"). The screen region 101A is generally rectangular, and the bezel region 101B may have a rectangular ring shape surrounding the screen region 101A. The screen region 101A is a substantially transparent region, and light generated from the display 121 may pass through the screen region 101A to be emitted to the outside. The bezel region 101B may be a substantially opaque region (e.g., a light-blocking region). For example, the bezel region 101B may include a layer including a light-blocking material. For example, the bezel region 101B may have a color similar to or the same as the side member 103.

According to various embodiments, the display 121 may be coupled to or disposed adjacent to a touch-sensitive a sensor, a pressure sensor capable of measuring touch intensity (pressure), and/or a pen sensor (digitizer) configured to detect a magnetic-field-type electronic pen.

The audio modules 1221, 1222, and 1223 may include a microphone hole 1221 and speaker holes 1222 and 1223. The microphone hole 1221 may include a microphone disposed therein so as to acquire external sound, and in some embodiments, the microphone hole 1221 may include multiple microphones disposed therein so as to sense the direction of sound. The speaker holes 1222 and 1223 may include an external speaker hole 1222 and a phone call receiver hole 1223. In some embodiments, the speaker holes 1222 and 1223 and the microphone hole 1221 may be implemented as a single hole, or a speaker (e.g., a piezo speaker) may be included without the speaker holes 1222 and 1223.

The sensor modules 1231 and 1232 may generate electrical signals or data values corresponding to an internal operating state or an external environmental state of the electronic device 100. The sensor modules 1231 and 1232 may include, for example, a first sensor module 1231 (e.g., a proximity sensor) and/or a second sensor module (not illustrated) (e.g., a fingerprint sensor) disposed on the front face 110A of the housing 110, and/or a third sensor module 1232 (e.g., an HRM sensor) disposed on the rear face 110B of the housing 110. The fingerprint sensor may be disposed not only on the front face 110A (e.g., the home key button 1251), but also on the second face 110B. The electronic device 100 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 1231.

The camera modules 1241, 1242, and 1243 may include a first camera device 1241 disposed on the front face 110A of the electronic device 100, a second camera device 1242 disposed on the second face 110B, and/or a flash 1243. The camera modules 1241, 1242, and 1243 may include one or more lenses, an image sensor, and/or an image signal processor. The flash 1243 may include, for example, a light-emitting diode or a xenon lamp. In some embodiments, two or more lenses (e.g., a wide-angle lens and a telephoto lens) and image sensors may be disposed on one face of the electronic device 100.

According to an embodiment, the key input devices 1251, 1252, and 1253 may include a home key button 1251 disposed on the front face 110A, a touch pad 1252 disposed in the vicinity of the home key button 1251, and/or a side key button 1253 disposed on the side face 110c. In another embodiment, the electronic device 100 may not include some or all of the above-mentioned key input devices 1251, 1252, and 1253, and a non-included key input device 1251, 1252, or 1253 may be implemented in another form, such as a soft key, on the display 121.

According to various embodiments, the electronic device 100 may include various light sensors disposed under the display 121 or along at least part of the rear face of the display 121. For example, the light sensors may be disposed adjacent to the rear face of the display 121 at a distance of about several hundred micrometers (um) or less. The light sensors may measure intensity or the like for various wavelength bands of light, and the electronic device 100 may quantitatively or qualitatively analyze materials using data measured from the light sensors.

According to an embodiment, a light sensor may include at least one light receiver or a photo detector such as a photodiode capable of detecting light in one or more wavelength bands.

According to an embodiment, the light receiver may detect light in a wavelength band for proximity detection (e.g., a maximum sensitivity wavelength of about 940 nm or about 950 nm). For example, in a proximity detection mode, when an external object or an object (e.g., a user's face) moves toward the front face 110A of the electronic device 100 to the vicinity of the light sensor, light in a wavelength band for proximity detection, output from a light emitter may be scattered or reflected by the external object. The light receiver may generate an electrical signal regarding the proximity of the external object or the like based on the scattered or reflected light.

According to an embodiment, the light receiver may detect light in the wavelength band for gesture detection (e.g., a maximum sensitivity wavelength of about 940 nm). For example, in the proximity detection mode, when the user's hand moves in the vicinity of the front face 110A of the electronic device 100, light in a wavelength band for gesture detection, output from the light emitter, may be scattered or reflected by the user's hand. The light receiver may generate an electrical signal regarding the gesture of the user's hand on the scattered or reflected light.

According to an embodiment, the light receiver may detect light in a wavelength band for object analysis. For example, in a biometric detection mode, when the user's body moves toward the front face 110A of the electronic device 100 to the vicinity of the light sensor, light in a wavelength band for biometric detection, output from the light emitter, may be scattered or reflected by the user's body. The light receiver may generate an electrical signal related to biometric information of the user's body (e.g., skin moisture, skin melanin, skin temperature, heart rate, blood flow rate, or iris) from the scattered or reflected light.

According to an embodiment, a light sensor may include at least one light emitter or a light source capable of generating light of one or more wavelength bands. The light emitter is able to generate light in all wavelength bands where the light receiver is capable of detecting light. For example, the light emitter may be configured as a single light emitter, such as a light emitting diode (LED), and the single light emitter may generate light in a broad wavelength band.

According to some embodiments, the light emitter may be configured to selectively generate light in a corresponding wavelength band under the control of the processor. For example, in the proximity detection mode, the control circuit may control the light emitter to generate light in the wavelength band for proximity detection, and in the biometric detection mode, the control circuit may control the light emitter to generate light in the wavelength band for biometric detection.

According to some embodiments, a light sensor may not include a light emitter, and may use a light source of another component such as the display 121. Light output through some pixels of the display 121 is reflected to an external object, and at least part of the reflected light may be introduced into the light receiver of the light sensor.

The side member 103 may include a mid-plate (not illustrated) extending from the outer structure 103A or coupled to the outer structure 103A, and the mid-plate may be disposed between the display 121 and the rear plate 102. A second sensor module including a fingerprint sensor or the like may be disposed between the display 121 and the mid-plate. According to some embodiments, the home key button 1251 may be omitted, and a software home button replacing the home key button 1251 may be displayed on the display 121. The second sensor module may be aligned below the location at which the software home button is displayed.

When a finger is brought into contact with the region in which the software home button is displayed, the light emitter of the second sensor module may output light in the corresponding wavelength band related to biometric recognition (e.g., fingerprint recognition), and the light may be delivered to the finger through the region in which the software home button is displayed. According to some embodiments, light in the corresponding wavelength band related to biometric recognition may be output in the region in which the software home button is displayed. At least part of the light (or light energy or a light signal) scattered or reflected from a finger may be introduced into the light receiver through the region in which the software home button is displayed. The light receiver may receive light in the wavelength band related to biometric recognition, may generate an electrical signal (a detection value or digital value) about the biometric information from the received light, and may transmit the electrical signal to a control circuit such as a processor of the electronic device 100.

The indicator 126 may be disposed, for example, on the front face 110A of the housing 110. The indicator 126 may include an LED as long as it can provide, for example, the state information of the electronic device 100 in an optical form.

The connector holes 1271 and 1272 may include a first connector hole 1271 capable of accommodating a connector (e.g., a USB connector) for transmitting and receiving power and/or data to and from an external electronic device, and/or a second connector hole 1272 capable of accommodating a connector (e.g., an earphone jack) for transmitting and receiving an audio signal to and from an external electronic device.

The electronic pen 128 may be inserted into the housing 110 or removed from the housing 110 through a hole (not illustrated) formed in the side face 110C. The electronic device 100 may include a device (e.g., a sensor) for detecting attachment/detachment of the electronic pen 128.

The display 121 may include a semiconductor element serving as a switch for controlling pixels. When external light, such as sunlight, enters the display 121, a photoelectric effect in which the semiconductor element absorbs light to generate a photon occurs, which may cause leakage current from the semiconductor element. The leakage current may cause a voltage drop on pixels, thereby lowering the luminance of the display 121. According to an embodiment, the electronic device 100 may include at least one first layer for reducing the electrical influence of external light, such as sunlight incident on the front face 110A, on the semiconductor element of the display 121. At least one first layer may be disposed between the front face 110A and the display 121 or may be included in the display 121. The first layer may block the light in a corresponding wavelength band from the external light such as sunlight from entering the semiconductor element of the display 121.

According to an embodiment, the at least one first layer may reflect, absorb, or block light having a wavelength at which the human eye cannot feel brightness in sunlight. According to an embodiment, the at least one first layer may reflect, absorb, or block light in the infrared band, which occupies a significant portion in the photoelectric effect on the semiconductor element in sunlight. Since the electronic device 100 is capable of reflecting, absorbing, or blocking light in the infrared band entering the display 121 using the at least one first layer, it is possible to relatively reduce leakage current from the semiconductor element, which is caused due to the photoelectric effect, compared with a conventional electronic device. When the leakage current from the semiconductor element is reduced, it is possible to suppress the luminance decrease of the display 121.

External light, such as sunlight entering the display 121, may be reflected from a lower medium disposed under the display and may be absorbed into the semiconductor element, and this reflected light may also cause leakage current from the semiconductor element, thereby causing luminance decrease of the display. According to an embodiment, when external light such as sunlight is incident on the front face 110A, some of the external light (e.g., light in the infrared band) may be reflected, absorbed, or blocked by the at least one first layer, and the remaining external light (e.g., light in the visible light band or light in the ultraviolet band) may pass through the display 121 and may be reflected from the lower medium to be introduced into the semiconductor element.

According to an embodiment, a first rear region of the display 121 may be coupled to a first lower medium including one or more layers, and a second rear region of the display 121 may be coupled to a second lower medium, which is at least partially different from the first lower medium including one or more layers. According to an embodiment, a portion of the first lower media may be disposed in the same layer as a portion of the second lower medium.

According to an embodiment, the second lower medium may include a second sensor module including a fingerprint sensor. According to some embodiments, the first sensor module 1231 including a proximity sensor or the like may be disposed between the display 121 and the mid-plate, and may form a portion of the second lower medium.

Light passing through the display 121 may be reflected from the first lower medium to be introduced into the first display region aligned to the first rear region, and may be reflected from the second lower medium to be introduced into the second display region aligned to the second rear region. The amount of light reflected from the first lower medium and introduced into the first display region may be determined by the reflectivity of the interface between the first lower medium and the first display region, and the reflectivity of the interface between the layers included in the first lower medium. Similarly, the amount of light reflected from the second lower medium and introduced into the second display region may be determined by the reflectivity of the interface between the second lower medium and the first display region, and the reflectivity of the interface between the layers included in the second lower medium. The reflectivity of an interface may be determined based on the refractive indexes of two media forming the interface.

According to an embodiment, the first lower medium and the second lower medium may be designed such that the amount of light reflected from the first lower medium and introduced into the first display region and the amount of light reflected from the second lower medium and introduced into the second display region are substantially the same. When the first lower medium and the second lower medium are designed as described above, the luminance change of the first display region and the luminance change of the second display region due to the electrical influence of reflected light may be substantially constant, and image quality may be improved.

Referring to FIG. 2, an electronic device 200 may include a side member 210, a display 220, a light sensor 230, a printed circuit board (PCB) 240, a support member 260 (e.g., a rear case), or a rear plate 280. In some embodiments, in the electronic device 200, at least one of the components (e.g., the support member 260) may be omitted, or other components may be additionally included. At least one of the components of the electronic device 200 may be the same as or similar to at least one of the components of the electronic device 100 of FIG. 1A or 1B, and a redundant description will be omitted below.

Referring to FIG. 2, the side member 210 may include an outer structure 210A formed of a metallic material and a mid-plate 210B (not illustrated) extending from the outer structure 210A or coupled to the outer structure 210A, and the mid-plate 210B may be disposed between the display 220 and the rear plate 280. The side member 210 may include an outer structure 210A and an inner structure 210C made of a material such as a polymer and coupled to the mid-plate 210C.

According to an embodiment, the display 220 may include a front plate 232 disposed on the opposite side to the rear plate 280.

According to an embodiment, the light sensor 230 may be disposed between the display 220 and the mid-plate 210B, and may be electrically connected to the printed circuit board 240 via an electrical connection means such as a flexible printed circuit board (FPCB). According to an embodiment, the display 220 may display a software home button at a position aligned with the light sensor 230. According to an embodiment, the light sensor 230 may be a fingerprint sensor, and when a finger is brought into contact with the region 222 on which the software home button is displayed, the fingerprint sensor or the display 220 may output light in a corresponding wavelength band related to fingerprint recognition, and the light may be delivered to the finger through the region 222 on which the software home button is displayed. At least some of the light scattered or reflected by the finger may be introduced into the fingerprint sensor through the region 222 on which the software home button is displayed, and the fingerprint sensor may generate and deliver the corresponding electrical signal to the printed circuit board 240. According to some embodiments, although not illustrated, a light sensor 230, such as a fingerprint sensor, may be installed in a region of the display 220 other than the region 222 on which the software home button is displayed, and a partial rear region of the display 220 aligned with the light sensor 230 may not be covered with a back cover, such as a light-blocking material.

According to an embodiment, the electronic device 200 may include at least one first layer for reducing the electrical influence of external light, such as sunlight incident on the display, on the semiconductor element of the display 220. The at least one first layer may block light in the infrared band in external light such as sunlight from entering the semiconductor element of the display 220.

According to an embodiment, the display 220 may have at least one second layer so as to reduce a luminance difference between the first display region 221 and the second display region 222 on the electrical influence of reflected light.

The printed circuit board 240 may be coupled to, for example, the side member 210, and may be disposed between the mid-plate 210B and the rear plate 280.

On the printed circuit board 240, a processor, memory, and/or an interface may be mounted. The processor may include at least one of, for example, a central processing unit, an application processor, a graphics processor, an image signal processor, a sensor hub processor, or a communication processor.

The memory may include, for example, volatile memory or nonvolatile memory.

The interface may include, for example, a high-definition multimedia interface (HDMI), a universal serial bus (USB) interface, an SD card interface, and/or an audio interface. The interface may electrically or physically connect, for example, the electronic device 200, to an external electronic device, and may include a USB connector, an SD card/an MMC connector, or an audio connector.

The support member 260 may be coupled to the side member 210, and may be disposed between the printed circuit board 240 and the rear plate 280. The support member 260 may be coupled to the mid-plate 210B together with the printed circuit board 240 using bolt fastening or the like, and may serve to cover and protect the printed circuit board 240.

The electronic device 200 may include a battery (not illustrated). The battery is a device for supplying power to at least one component of the electronic device 200, and may include, for example, a non-rechargeable primary battery, a rechargeable secondary battery, or a fuel cell. At least part of the battery may be disposed to be substantially flush with, for example, the circuit board 240. The battery 250 may be integrally disposed within the electronic device 200, or may be detachably mounted on the electronic device 200.

The electronic device 200 may include an antenna (not illustrated). The antenna may be disposed between the rear plate 280 and the battery. The antenna may include, for example, a near field communication (NFC) antenna, a wireless charging antenna, and/or a magnetic secure transmission (MST) antenna. The antenna may perform short-range communication with, for example, an external electronic device, or may transmit/receive power required for charging to/from an external device in a wireless manner. In another embodiment, an antenna structure may be formed by the side structure 210, a portion of the support member 260, or a combination thereof.

According to various embodiments, the electronic device 200 may further include various components (modules) according to the provided type thereof. Although it is impossible to list all of these components since the components are modified very diversely according to the convergence trend of digital devices, the electronic component 200 may further include components equivalent to the above-mentioned components. According to various embodiment, in the electronic device 200, specific components may be omitted from the above-mentioned components or may be replaced by other components according to the provided type of the electronic device 200.

Figure 3:
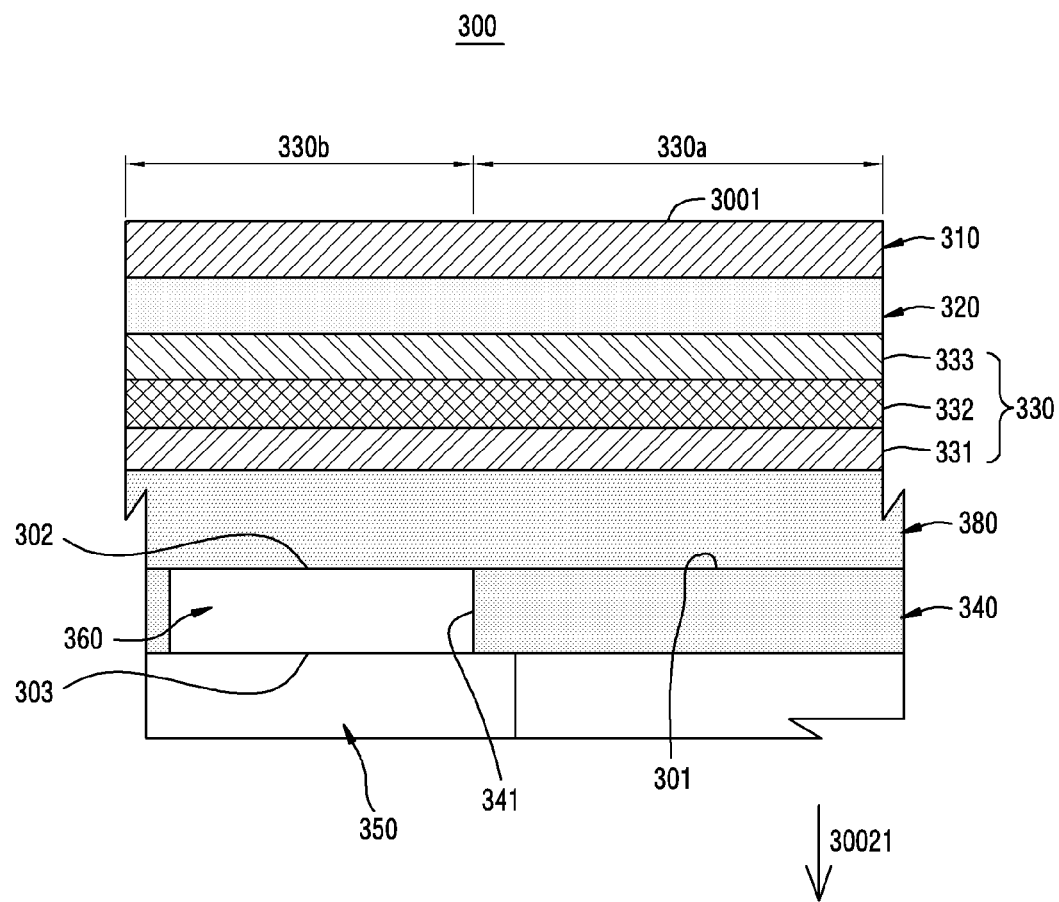
FIG. 3 is a cross-sectional view of a portion of the electronic device including a display according to an embodiment.
Figure 4:
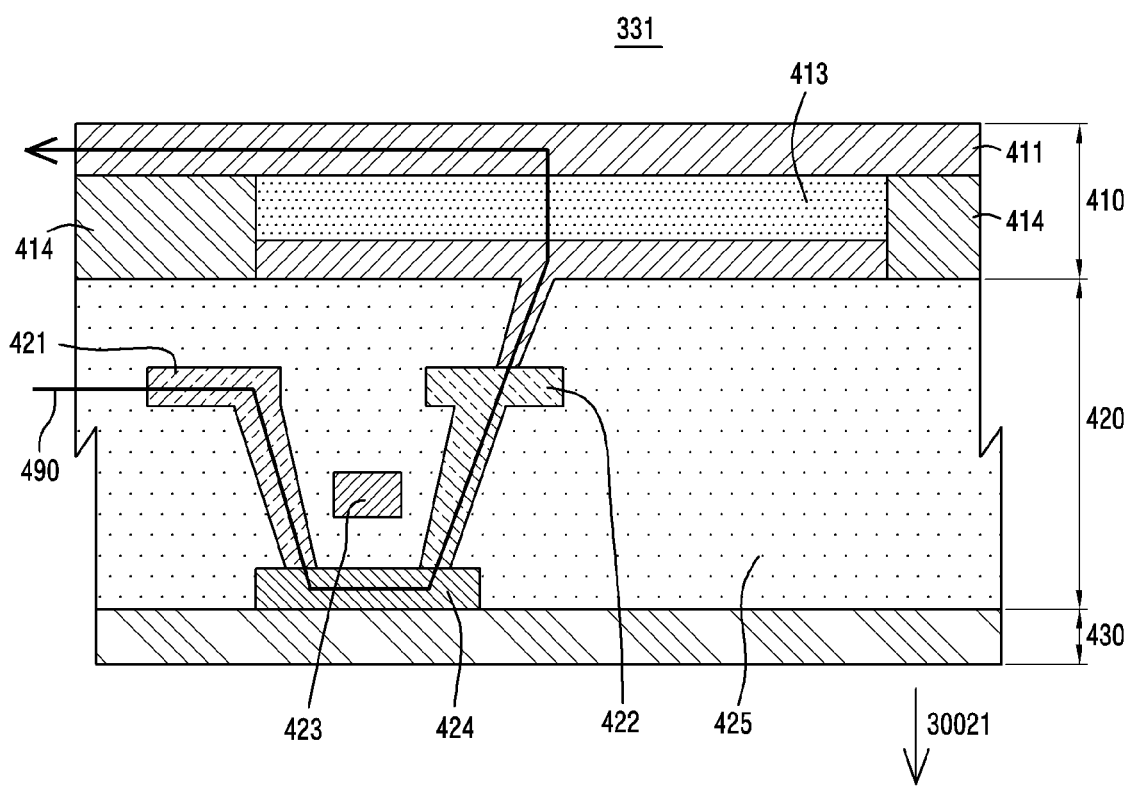
FIG. 4 is a cross-sectional view of a schematic structure of a display panel according to an embodiment.

FIG. 3 is a cross-sectional view of a portion of the electronic device including a display according to an embodiment. FIG. 4 is a cross-sectional view of a schematic structure of a display panel according to an embodiment.

Referring to FIG. 3, for example, when an element A, an element B, and an element C are disposed in this order in a second direction 30021, it may be defined that the element A is disposed on the element B and the element C is disposed under the element B. The electronic device 300 may include a transparent layer 310 (e.g., the front plate 101 in FIG. 1A), a display 330 disposed under the transparent layer 310, and a light sensor 350 disposed under the display 330. The light output from the light sensor 350 or the display 330 may be emitted to the outside through the display 330 and the transparent layer 310, and the light scattered or reflected from the external object may be introduced into the light sensor 350 through the transparent layer 310 and the display 330. According to an embodiment, various sensors may be applied to the light sensor 350, and the light sensor 350 may be a proximity sensor or a biometric sensor.

The transparent layer 310 may include, for example, a light-transmissive glass plate, a polymer plate, or the like, which forms the front face 3001 of the electronic device.

The display 330 may include, for example, a display panel 331 electrically connected to the processor of the electronic device so as to output light related to an image. Referring to FIG. 4, the display panel 331 may include a pixel layer 410 and a substrate layer 420. The pixel layer 410 may include an organic light-emitting diode (OLED), and may include a first electrode 411, a second electrode 412 disposed under the first electrode 411, and an organic layer 413 disposed between the first electrode 411 and the second electrode 412. The second electrode 412 corresponds to a positive pole that emits holes, and may be an anode electrode including a light-transmissive indium tin oxide (ITO), an antimony tin oxide (ATO), or the like. The first electrode 411 corresponds to a negative pole that emits electrons, and may be a cathode electrode including Al, Si, Li, Ca, Mg, or the like.

The substrate layer 420 may include a thin film transistor (TFT) disposed under the pixel layer (or the OLED layer) 410. According to an embodiment, the substrate layer 420 may include a source electrode 421, a drain electrode 422, a gate electrode 423, and a semiconductor layer 424. The source electrode 431 may be an electrode that supplies electrons, and the drain electrode 432 may be an electrode that receives electrons and may be electrically connected to the second electrode 412. The gate electrode 423 may be an electrode for controlling electron movement from the source electrode 421 to the drain electrode 422. The semiconductor layer 424 including a semiconductor material such as Si may be electrically connected to the source electrode 431 and the drain electrode 432, and may become a path that enables movement of electrons like a conductor when a voltage equal to or higher than a predetermined level is applied to the gate electrode 433. In some embodiments, the semiconductor layer 434 may be defined as an "active layer" or an "active region". The substrate layer 420 may include an insulating portion (or insulating layer) 425 of an insulating material for separating the gate electrode 423 from other portions.

Due to the reaction of the semiconductor layer 424, current may flow along a path 490 formed by the source electrode 421, the semiconductor layer 424, the drain electrode 422, the second electrode 412, the organic layer 413, and the first electrode 411. When a voltage is applied to the first electrode 411 and the second electrode 412 due to this current flow, electrons emitted from the second electrode 412 and holes emitted from the first electrode 411 are coupled in the organic layer 413 and exciton energy due to the coupling of the electrons and the holes may be emitted from the organic layer 413 in the form of light. The first electrode 411 is a common electrode for a plurality of pixels, and the second electrode 412 and the organic layer 413 may be elements for one pixel. Hereinafter, the second electrode 412 and the organic layer 413 will be referred to as a "pixel layer". The display panel 331 may include a plurality of pixel layers (not illustrated) disposed under the first electrode 411. The OLED layer 410 may include an insulating portion (or an insulating layer) 414 of an insulating material disposed between the pixel layers.

Referring to FIGS. 3 and 4, the display panel 331 may include a substrate 430 of a light-transmissive material, such as glass, to which the OLED layer 410 and the substrate layer 420 are coupled, and the substrate layer 420 may be disposed between the OLED layer 410 and the substrate 430.

The display panel 331 may further include other various layers (not illustrated). For example, the display panel 331 may include a light-transmissive buffer layer formed of a material, such as silicon oxide or silicon nitride and disposed between the substrate layer 420 and the substrate 430. For example, the display panel 331 may include a protection layer formed of a polymer or the like disposed between the buffer layer and the substrate 430.

Referring to FIGS. 3 and 4, when external light, such as sunlight, is introduced into the display 330, a photoelectric effect occurs in which the semiconductor layer 424 absorbs light to generate photoelectrons, which may cause leakage current from the semiconductor layer 424.

The leakage current may cause a voltage drop on pixels, thereby lowering the luminance of the display 330. According to an embodiment, the electronic device 300 may include at least one first layer 320 for reducing the electrical influence of external light, such as sunlight incident on the front face 3001 thereof, on the semiconductor layer 424 of the display 330. The at least one first layer 320 may be disposed between the front face 3001 and the display 330 or may be included in the display 330. The first layer 320 may block the light in a corresponding wavelength band from the external light such as sunlight from entering the semiconductor layer 424 of the display 330. According to an embodiment, the first layer 320 may be a film disposed between the transparent layer 310 and the display 330, or may include a material coated on the transparent layer 310 or the display 330.

According to some embodiments, the first layer 320 may be disposed on the transparent layer 310, between the polarization layer 333 and the phase retardation layer 332, or between the phase retardation layer 332 and the display panel 331.

Figure 5A:
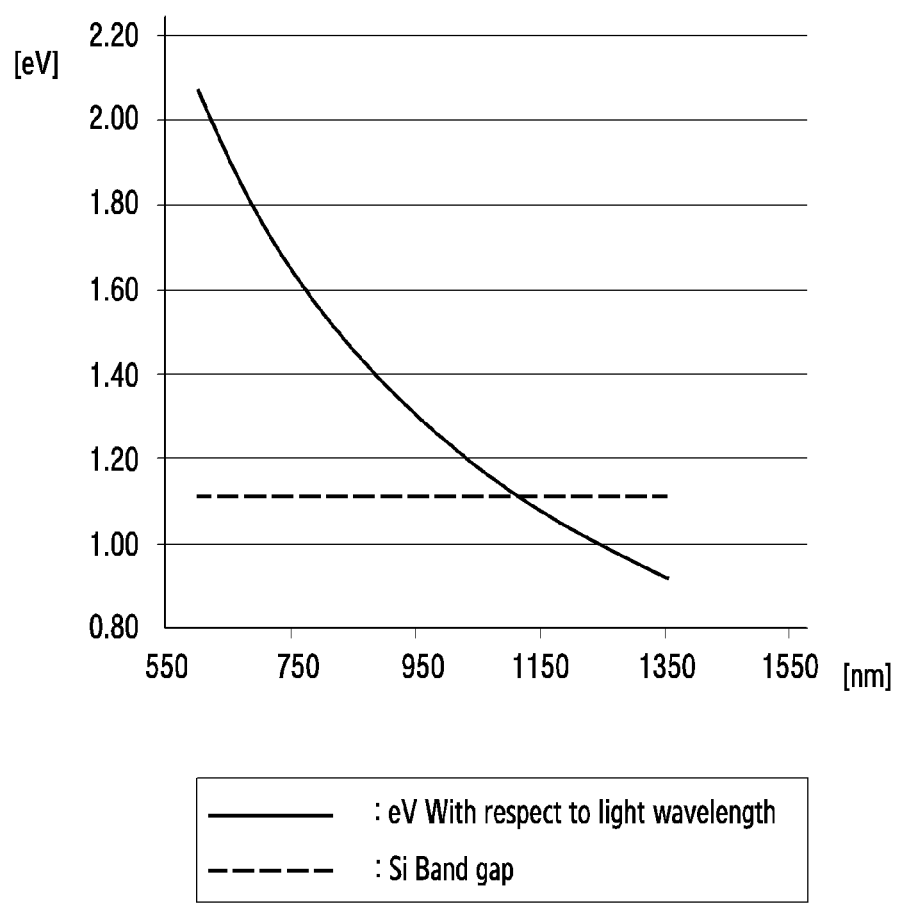
FIG. 5A is a graph concerning eV and the band gap of Si with respect to light wavelength.

FIG. 5A is a graph concerning eV and the band gap of Si with respect to light wavelength. Referring to FIG. 5A, infrared rays, which have high energy (eV) compared to the band gap (e.g., 1.11 eV) of Si, which is a material of a semiconductor layer, are able to excite electrons.

Figure 5B:
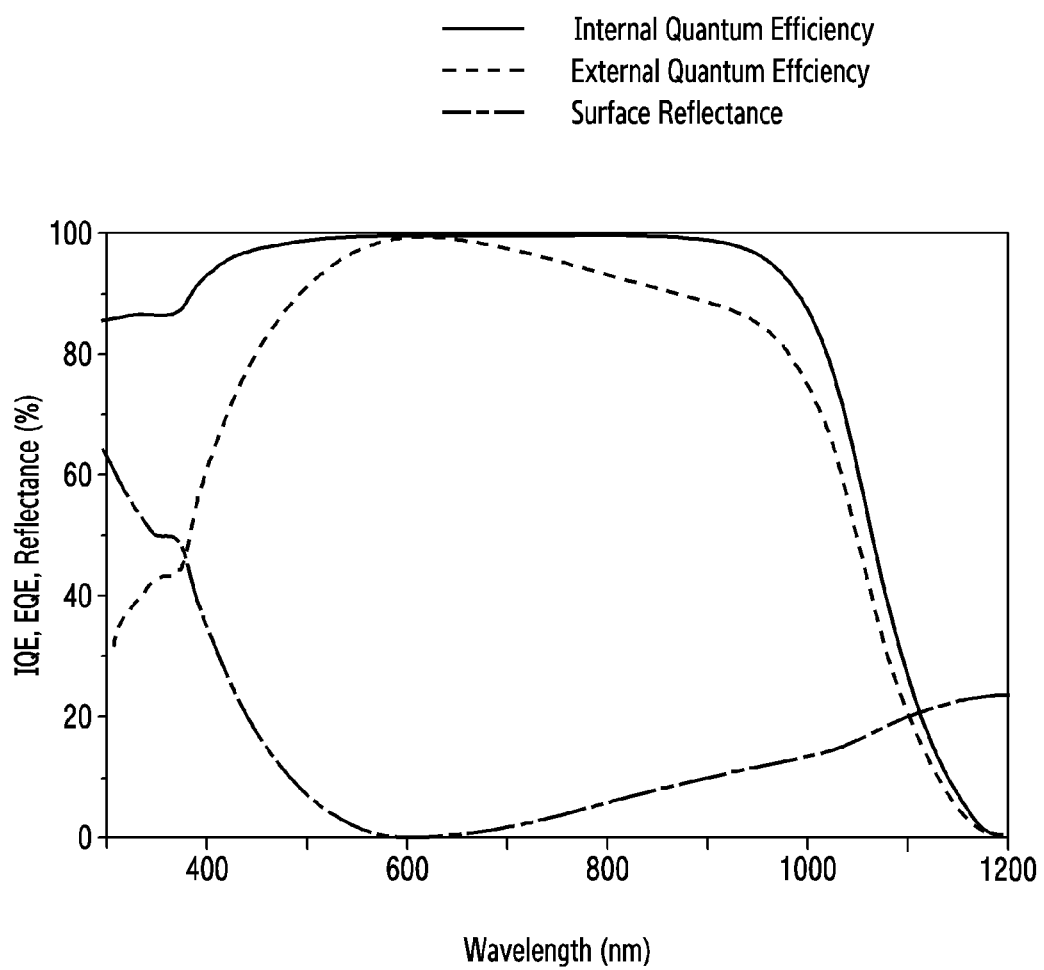
FIG. 5B is a graph representing photoelectric effects measured for each wavelength for a Si specimen.

FIG. 5B is a graph representing photoelectric effects measured for each wavelength for a Si specimen. Referring to FIG. 5B, in view of the external quantum efficiency of a Si specimen, it can be seen that photoelectric effects are induced not only by light in the visible light band, but also by light in the infrared band.

Figure 5C:
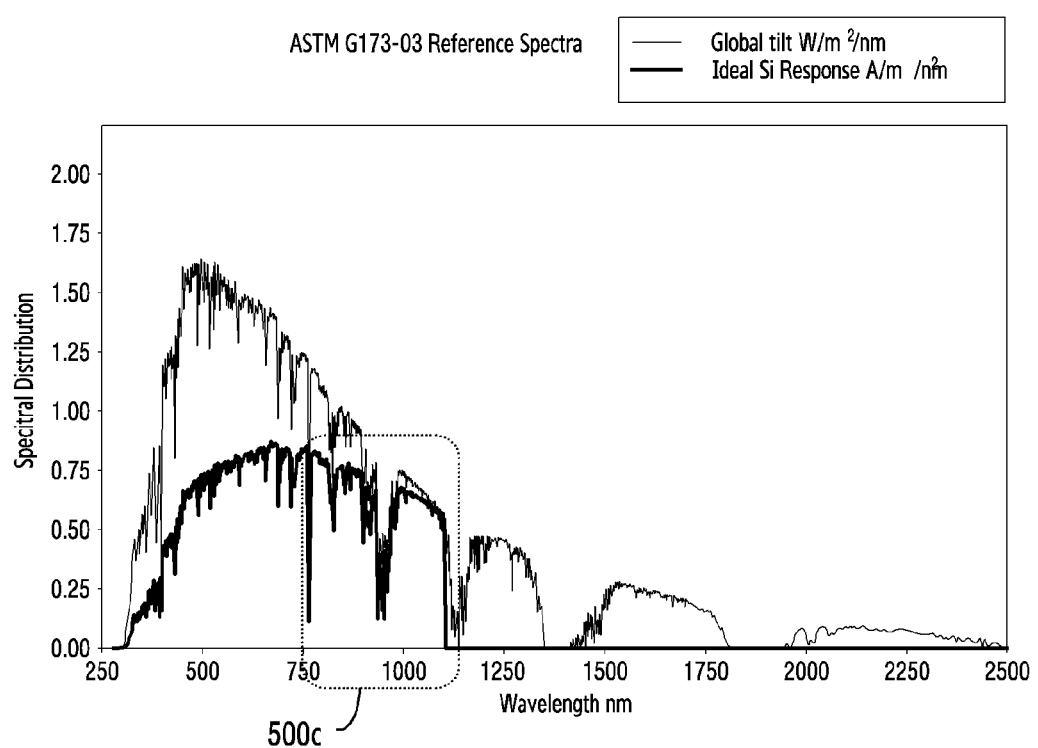
FIG. 5C is a graph representing energy per unit area transmitted to a Si specimen, and current per unit area output by the Si specimen in response to the energy for each wavelength.

FIG. 5C is a graph representing power (W) (e.g., solar energy) (W/m²/nm) incident on a predetermined area (or a unit area (m²)) for each wavelength (nm) transmitted to a silicon (Si) specimen, and the amount of current (A) (A/m²/nm) output when the Si specimen responds to the power and incident on a predetermined area (or a unit area (m²)) for each wavelength (nm). Referring to the portion indicated by 500c of FIG. 5c, it can be seen that not only the light in the visible light band but also the light in the infrared band occupies a significant portion in the photoelectric effects.

Figure 5D:
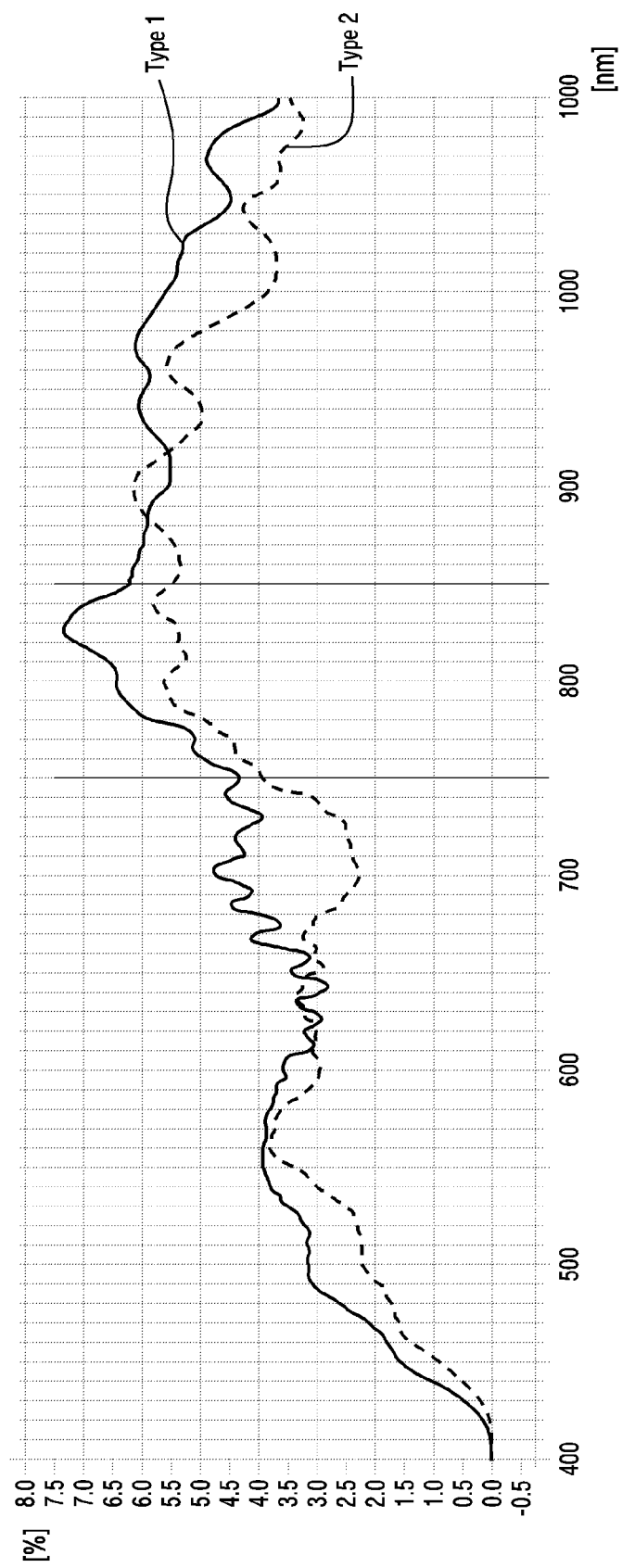
FIG. 5D is a graph representing transmittances of on-cells of a display according to an embodiment for each light wavelength.

FIG. 5D is a graph representing transmittances of on-cells of a display according to an embodiment for each light wavelength. With respect to on-cells corresponding to Type 1 and Type 2, it can be seen that the transmittance of light in the infrared band is generally higher than that of light in the visible light band. It can be said that light in the infrared band is more likely to reach the semiconductor layer of a TFT.

Referring to FIGS. 5A, 5B, 5C, and 5D, when light in the infrared band is blocked from entering the display 330 of FIG. 3, it is possible to reduce the electrical influence of external light, such as sunlight, on the display 330.

Referring to FIG. 3, according to an embodiment, the first layer 320 may be disposed between the transparent layer 310 and the display 330. The first layer 320 may reflect, absorb, or block light in the infrared band and may transmit light in the visible light band. Since the light in the infrared band, introduced into the display 330 using the at least one first layer 320 is reflected, absorbed, or blocked, the electronic device 300 is capable of relatively reducing leakage current from the semiconductor layer 424 in FIG. 4, which is caused by a photoelectric effect due to external light, compared to a conventional electronic device. When the leakage current from the semiconductor layer is reduced, it is possible to suppress the luminance decrease of the display 330.

According to an embodiment, in the external light, such as sunlight, incident on the front face 3001, light in the infrared band may be reflected, absorbed or blocked by the first layer 320, and light in the ultraviolet band and light in the visible light band may be introduced into the display 330. The light in the ultraviolet band and the light in the visible light band may cause leakage current due to the photoelectric effect in the semiconductor layer 424 of FIG. 4, and may cause a voltage drop on the pixels, thereby lowering the luminance of the display 330. According to an embodiment, the electronic device 300 may further include a layer for blocking the light in the ultraviolet band from entering the display 330, and it is possible to suppress the luminance decrease of the display 330 caused due to the light in the ultraviolet band. According to an embodiment, the transparent layer 310 may include a material for reflecting, absorbing, or blocking light in the ultraviolet band. According to some embodiments, the first layer 320 may include a material for reflecting, absorbing, or blocking light in the ultraviolet band. According to some embodiments, the display 330 may include a layer for blocking light in the ultraviolet band from entering the display panel 331.

According to an embodiment, when the light sensor 350 is designed to use light in the infrared band, such as 950 nm, light in the infrared band output from the light sensor 350 or light in the infrared band scattered or reflected from an external object may be difficult to pass through the first layer 320. According to an embodiment, the processor of the electronic device 300 may perform a pixel driving routine that causes pixels to be turned off (or deactivate) for a partial time of a frame (or an image frame). For example, the pixel driving routine may be designed to turn off pixels at a defined time ratio in a frame. The processor of the electronic device 300 may turn on (activate) a pixel for a predetermined time in a frame and may turn off (deactivate) the pixel for the remaining time according to the pixel driving routine. According to an embodiment, the display 300 may be an active matrix organic light-emitting diodes (AMOLED) display in a form including at least one TFT that individually controls a pixel. According to an embodiment, the pixel driving routine may be an AMOLED impulsive drive (AID), and a ratio of turning on a pixel in the frame may be defined as an "AID ratio". According to an embodiment, in the detection mode using the light sensor 350, the processor of the electronic device 300 may perform the light sensor driving routine such that, in a section in which the pixel is turned off, the light sensor 350 outputs light and receives light scattered or reflected from an external object.

Referring to FIG. 3, the display 330 may include a second display region 330b aligned with the light sensor 350 such as a fingerprint sensor, and a first display region 330a in addition to the second display region 330b. According to an embodiment, an air layer 360 may exist between the second display region 330b and the light sensor 350. According to an embodiment, the electronic device 300 may include a back cover 340 coupled to the rear face of the first display region 330a of the display 330, and the air layer 360 may be formed by a hole 341 formed in the back cover 340. The back cover 340 may support and protect the display panel 311, and may include a material capable of absorbing or blocking external light or light or electromagnetic waves generated from the display panel 311. According to an embodiment, the back cover 340 may include a black film and a metal (e.g., copper) plate. According to some embodiments, the back cover 340 may be included in the display panel 311.

According to an embodiment, by the media coupled to the rear face of the display 330, a first interface 301 between the first display region 330a and the back cover 340, a second interface 302 between the second display region 330b and the air layer 360, and a third interface 303 between the air layer 360 and the light sensor 350 may be formed. The reflectivity of an interface 301, 302, or 303 may be determined based on the refractive indexes of two media forming the interface. For example, the greater the difference in refractive index between the two media, the greater the reflectivity of the interface between the two media. According to an embodiment, the reflectivity of the first interface 301 may be about 1.7%, and the reflectivity of the second interface 302 or the third interface 303 may be about 4%.

For example, when external light such as sunlight is incident on the front face 3001, some of the external light (e.g., light in the infrared band) may be absorbed or blocked by the at least one first layer 320, and the remaining external light (e.g., light in the visible light band or light in the ultraviolet band) may pass through the display 330. Light passing through the display 330 may be reflected from the first interface 301. Light passing through the display 330 may be reflected from the second interface 302, and light passing through the air layer 360 may be reflected from the third interface 303.

Light passing through the display 330 may be reflected from the medium layers including the first interface 301, and reflected light having a first light amount may be introduced into the first display region 330a. Light passing through the display 330 may be reflected from the medium layers including the second interface 302 and the third interface 303, and reflected light having a second light amount may be introduced into the second display region 330b. According to an embodiment, the first light amount reflected from the medium layers including the first interface 301 and the second light amount reflected from the medium layers including the second interface 302 and the third interface 303 may be different from each other. According to an embodiment, when the first light amount and the second light amount are different from each other, it may mean that the difference between the first light amount and the second light amount exceeds a set threshold. In addition, when the first light amount and the second light amount are substantially the same, it may mean that the difference between the first light amount and the second light amount does not exceed a set threshold.

Figure 5E:
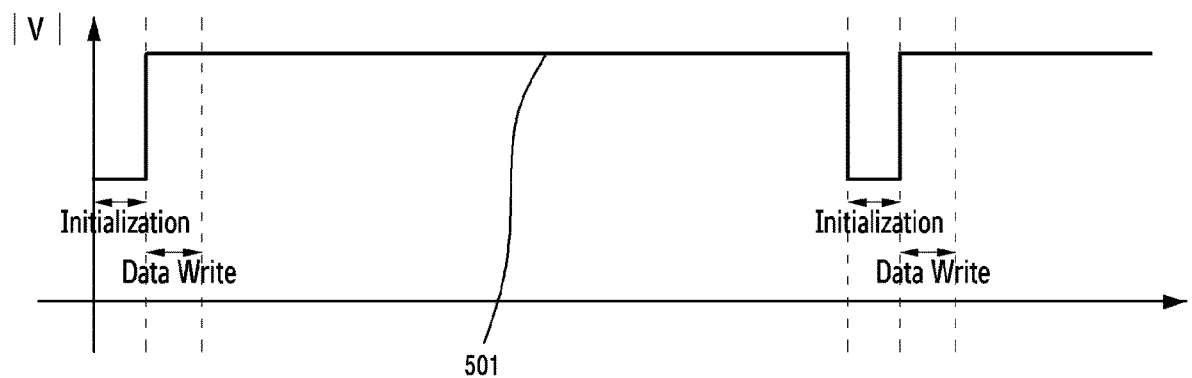
FIG. 5E represents a voltage change of a storage capacitor of the display when external light is not incident on the electronic device or external light having a low illuminance is incident on the same.
Figure 5F:
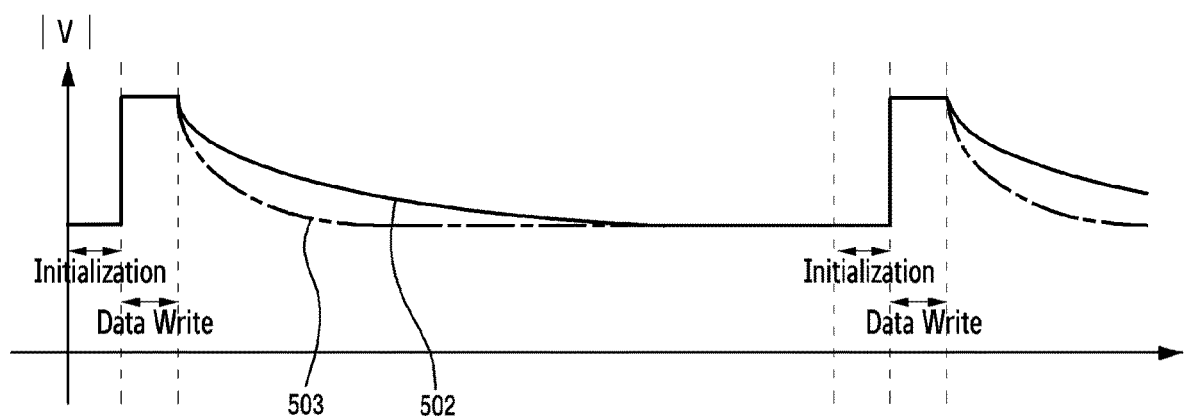
FIG. 5F represents a voltage change of a storage capacitor of the display when external light having a high illuminance is incident on the electronic device.

When the first light amount reflected from the medium layers including the first interface 301 and the second light amount reflected from the medium layers including the second interface 302 and the third interface 303 are different from each other, a luminance change in the first display region 330a and a luminance change in the second display region 330b, which are caused by the electrical influence of the reflected light, may be different from each other. For example, the second display region 330b may emit light having a lower luminance than the first display region 330a. FIG. 5E represents a voltage change of a storage capacitor of the display 330 when external light is not incident on the electronic device 300 of FIG. 3 or external light having a low illuminance is incident on the same. FIG. 5F represents a voltage change of a storage capacitor of the display 330 when external light having a high illuminance is incident on the electronic device 300 of FIG. 3. The display panel 331 may include a light-emitting element (e.g., an OLED), at least one TFT, and a storage capacitor. The at least one TFT may include a TFT that serves as a switch and a driving TFT, which causes current to flow to the light-emitting element. The storage capacitor may be defined as an element that maintains a voltage signal in a pixel, an element that maintains a voltage applied to a pixel within one frame, or an element that reduces a change in the gate voltage of the TFT due to leakage current during a light emission time. By a routine for controlling at least one TFT (e.g., initialization or data write), the storage capacitor is able to maintain the voltage applied to a pixel at regular time intervals. Referring to FIG. 5E, even if external light is not incident or external light having a low illuminance is incident, there is no or little electrical influence of the external light on the display 330. Thus, the voltage of the storage capacitor for the first display region 330a and the second display region 330b can be maintained (501) without dropping. Referring to FIG. 5F, it can be seen that when external light having a high illuminance is incident, the voltage drop 502 of the second display region 330b is greater than the voltage drop 503 of the first display region 330a due to the electrical influence by the external light. Since the voltage drop 502 of the second display region 330b is greater than the voltage drop 501 of the first display region 330a, the second display region 330b may emit light having a lower luminance than that of the first display region 330a.

According to an embodiment, in order to ensure that the first light amount reflected by the first display region 330a and the second light amount reflected by the second display region 330b are substantially the same, at least one medium layer (not illustrated) may be interposed in at least one of the first interface 301, the second interface 302, and the third interface 303.

The display 330 according to an embodiment may include a phase retardation layer (or retarder) 332 disposed on the display panel 331 and a polarization layer (or a polarizer)

333 disposed on the phase retardation layer 332. According to an embodiment, when unpolarized light such as sunlight travels in a second direction 30021, the unpolarized light passes through the polarization layer 333 to turn into linearly polarized light, and the linearly polarized light may pass through the phase retardation layer 332 to turn into a circularly polarized light. For example, when the unpolarized light passes through a 90 degree polarization layer 333, the unpolarized light may be changed to 90 degree linearly polarized light, and when the 90 degree linearly polarized light passes through a 45 degree phase retardation layer 332, the 90 degree linearly polarized light may be changed to 135 degree circularly polarized light. The 135 degree circularly polarized light may have value between 90 degrees and 180 degrees, which are linear polarization axes, and may oscillate in both the X and Y axes, that is, with 90 degree and 180 degree phases. The circularly polarized light is not placed on a specific axis, and is able to change the axis while evenly oscillating. According to an embodiment, the phase retardation layer 332 may have the characteristic of a quarter wave retarder ($\lambda/4$ retarder).

Referring to FIGS. 3 and 4, when sunlight is incident on the transparent layer 310, most of the light may be reflected from the electrodes included in the substrate layer 420, the OLED layer 410, and the like, which may cause difficulty in screen recognition. According to an embodiment, the polarization layer 333 and the phase retardation layer 332 may prevent light, entering from the outside, from being reflected, thereby improving outdoor visibility. For example, the 135 degree circularly polarized light changed by the phase retardation layer 332 may be reflected on the substrate layer 420 or the OLED layer 410, and the reflected 135 degree circularly polarized light may be changed to 180 degree linearly polarized by passing through the phase retardation layer 332. Then, the 180 linearly polarized light cannot be emitted to the outside through the 90 degree polarization layer 333. According to some embodiments, a single layer in which the polarization layer 333 and the phase retardation layer 332 are combined may be provided, and such a layer may be defined as a "circular polarization layer".

According to various embodiments, the electronic device 300 may further include at least one layer 380 formed of various light-transmissive materials such as polyethylene and a polymer and disposed under the display 330. A portion of the back cover 340 is disposed between the layer 380 and the light sensor 350, and the air layer 360 may be formed by a space surrounded by the layer 380, the light sensor 350, and the back cover 340. According to some embodiments, the layer 380 include a plurality of holes (not illustrated), which may serve to facilitate the separation of the display 330 and the back cover 340.

Figure 6:
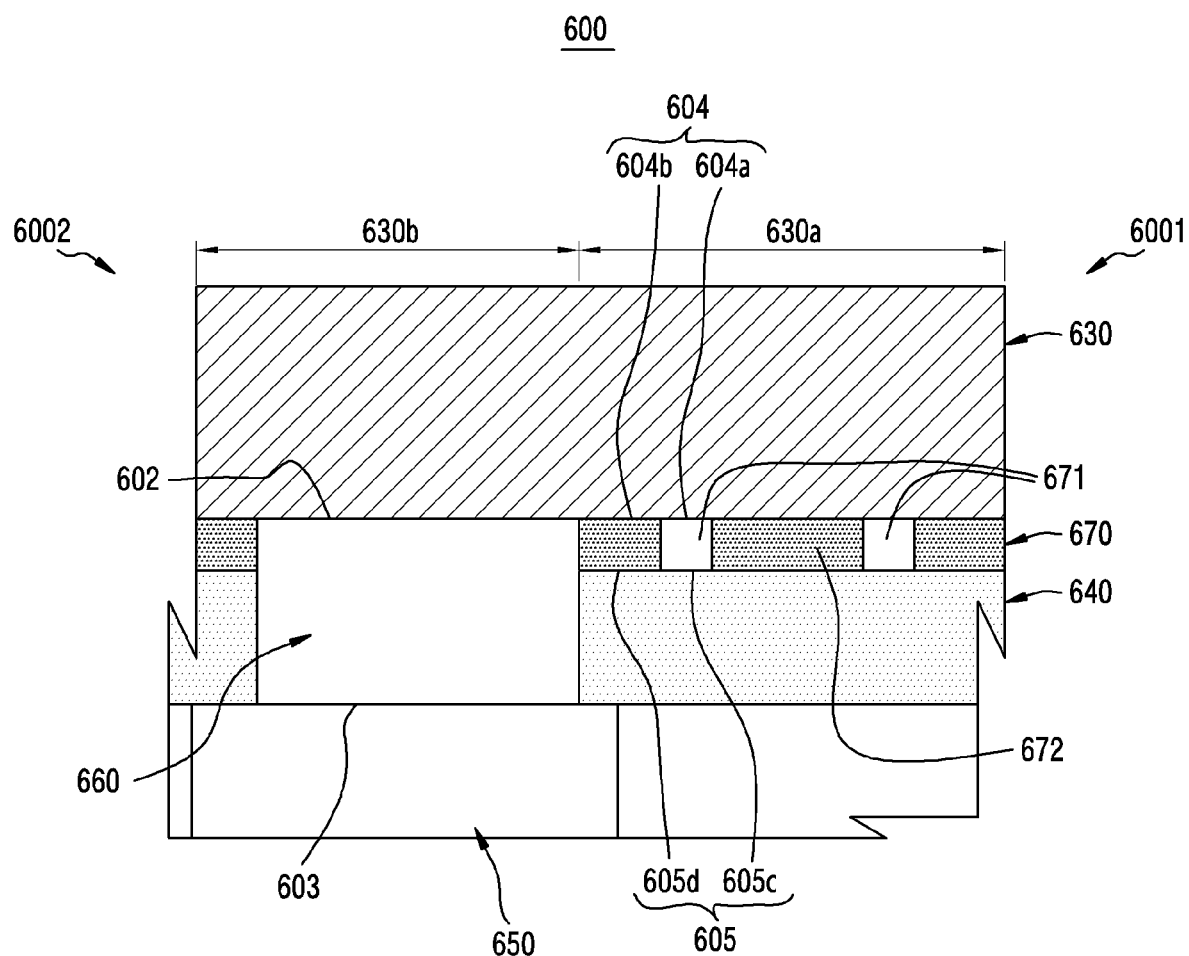
FIG. 6 is a cross-sectional view of a portion of the electronic device including a display according to an embodiment.

FIG. 6 is a cross-sectional view of a portion of the electronic device including a display according to an embodiment. At least one of the components of the electronic device 600 may be the same as or similar to at least one of the components of the electronic device 300 of FIG. 3, and a redundant description is omitted below.

Referring to FIG. 6, in an embodiment, the display 630 may include a first layer that substantially reflects, absorbs, or blocks light in the infrared band. The electronic device 600 may include a flexible layer 670 of a light-transmissive material disposed between the first display region 630a of the display 630 and the back cover 640. According to an embodiment, the flexible layer 670 may include a plurality of holes 671, which may serve to facilitate the separation of the display 630 and the back cover 640. In some embodiments, the flexible layer 670 including these holes may be referred to as an "embossed layer". The light sensor 650 may be disposed under the display 630, and an air layer 660 may exist between the display 630 and the light sensor 650.

According to an embodiment, by the media coupled to the rear face of the display 630, a second interface 602 between the second display region 630b and the air layer 660, a third interface 603 between the air layer 660 and the light sensor 650, a fourth interface 604 between the first display region 630a and the flexible layer 670, and a fifth interface 605 between the flexible layer 670 and the back cover 640 may be formed. The fourth interface 604 may include an a-interface 604a between the first display region 630a and the air in the holes 671 and a b-interface 604b between the first display region 630a and a region 672 other than the holes 671. The fifth interface 605 may include a c-interface 605c between the air in the holes 671 and the bag cover 640 and a d-interface 605d between the region 672 other than the holes 671 and the bag cover 640. The reflectivity of an interface 602, 603, 604a, 604b, 605a, or 605b may be determined based on the refractive indexes of two media forming the interface.

According to an embodiment, when external light such as sunlight is incident on the display 630, some of the external light may be reflected, absorbed, or blocked by the first layer, and the remaining external light (e.g., light in the visible light band or light in the ultraviolet band) may pass through the display 630. Light passing through the display 630 may be reflected from the second interface 602 and the fourth interface 604. Light passing through the flexible layer 670 may be reflected from the fifth interface 605. In addition, light passing through the display 660 may be reflected from the third interface 603.

According to an embodiment, light passing through the display 630 may be reflected from first medium layers 6001 including the fourth interface 604 and the fifth interface 605, and reflected light having a first light amount may be introduced into the first display region 630a. In addition, light passing through the display 630 may be reflected from second medium layers 6002 including the second interface 602 and the third interface 603, and reflected light having a second light amount may be introduced into the second display region 630b. According to an embodiment, the first light amount reflected from the first medium layers 6001 and the second light amount reflected from the second medium layers 6002 may be different from each other. According to an embodiment, when the first light amount and the second light amount are different from each other, it may mean that the difference between the first light amount and the second light amount exceeds a set threshold. For example, the average reflectivity of the fourth interface 604 including the a-interface 604a and the b-interface 604b may be about 1.7%, and the average reflectivity of the second interface 602 or the third interface 603 may be about 4%. Due to this, the second light amount may be greater than the first light amount.

According to an embodiment, when the first light amount of the reflected light transmitted to the first display region 630a and the second light amount of the reflected light transmitted to the second display region 630b are different, the first display due to the electrical influence of the reflected light. The luminance change of the region 630a and the luminance change of the second display region 630b may not be the same. For example, due to the reflected light, the second display region 630b may emit light having a lower luminance than the first display region 630a, which may make it difficult to ensure image quality.

According to an embodiment, although not illustrated, in order to ensure that the first light amount and the second light amount are substantially the same, at least one medium layer (not illustrated) may be interposed in at least one of the second interface 602, the third interface 603, the fourth interface 604, and the fifth interface 605. A structure in this regard will be described below with reference to FIG. 7.

Figure 7:
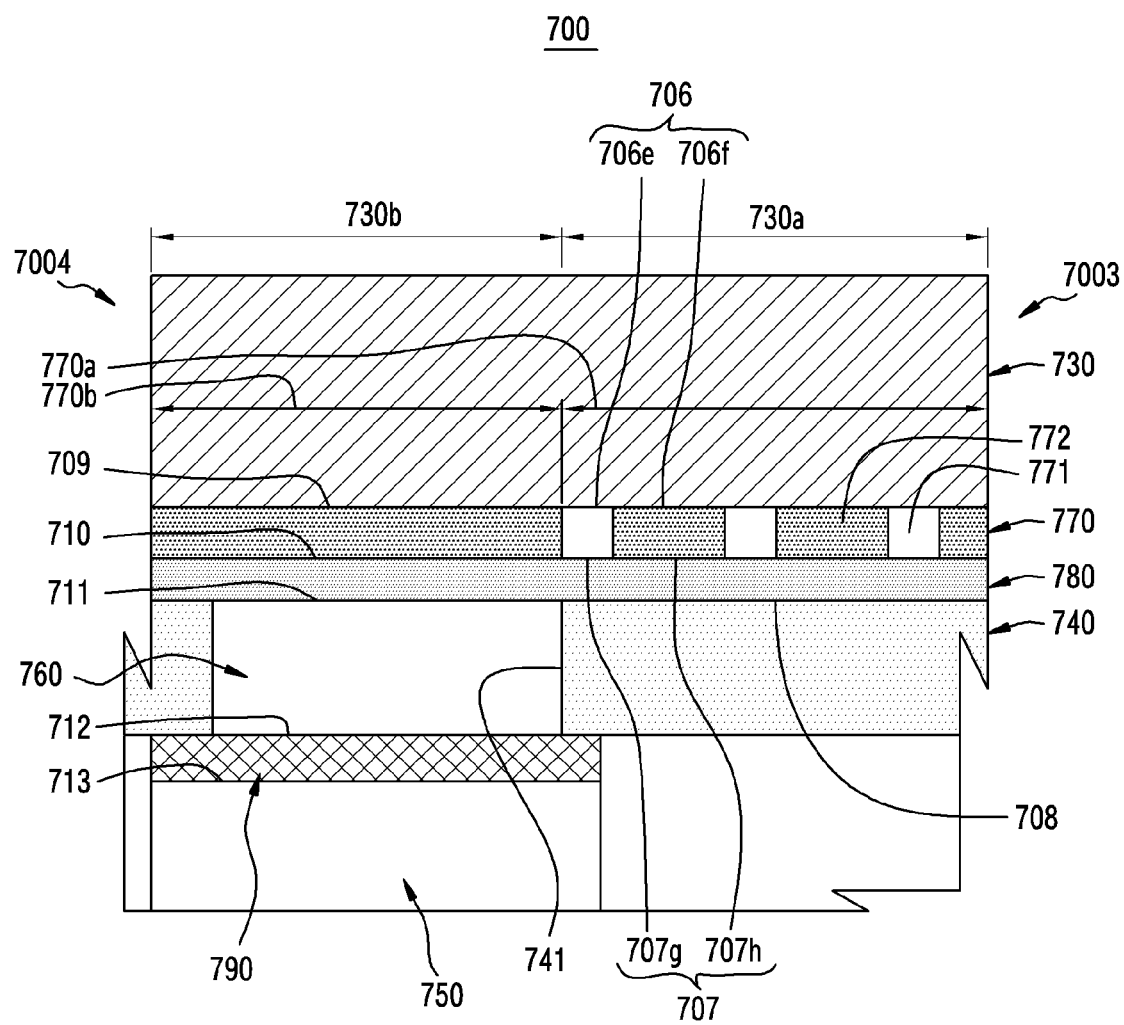
FIG. 7 is a cross-sectional view of a portion of the electronic device including a display according to an embodiment.

FIG. 7 is a cross-sectional view of a portion of the electronic device including a display according to an embodiment. At least one of the components of the electronic device 700 may be the same as or similar to at least one of the components of the electronic device 600 of FIG. 6, and a redundant description is omitted below.

Referring to FIG. 7, the display 730 may include a first layer that substantially reflects, absorbs, or blocks light in the infrared band. The electronic device 700 may include a flexible layer 770 (e.g., the layer 370 in FIG. 3) of a light-transmissive material coupled to the rear face of the display 730. According to an embodiment, the flexible layer 770 may include a first region 770a coupled to the first display region 730a of the display 730 and a second display region 770b coupled to the second display region 730b of the display 730.

In an embodiment, the electronic device 700 may include a back cover 740 aligned under the first region 770a. According to an embodiment, the electronic device 700 may include a second layer 780 disposed between the flexible layer 770 and the back cover 740. According to an embodiment, the second layer 780 may include an anti-reflection material for suppressing light reflection and improving transmittance. According to an embodiment, the second layer 780 may be a film disposed under the flexible layer 770, and may be coupled to the flexible layer 770 via optically transparent adhesive or the like. According to some embodiments, the second magnet 780 may include a material coated on the flexible layer 770.

According to an embodiment, the electronic device 700 may include a third layer 790 disposed between the air layer 760 and the light sensor 750. The third layer 790 may include an anti-reflection material for suppressing light reflection and improving transmittance. According to an embodiment, the third layer 790 may be a film disposed under the flexible layer 750, and may be coupled to the flexible layer 750 via optically transparent adhesive or the like. According to some embodiments, the third layer 790 may include a material coated on the light sensor 750.

According to an embodiment, the second layer 780 or the third layer 790 may be formed of various materials having a reflectivity of about 1% or less, a transmittance of about 99%, or an absorbance of about 2% or less in air.

According to an embodiment, the electronic device 700 may include a light sensor 750 aligned under the first region 770a of the flexible layer 770, and an air layer 660 may exist between the display 730 and the light sensor 750. Light output from the light sensor 750 may be emitted to the outside through the air layer 760, the second region 770b, the second display region 730b, and at least one layer coupled thereto. The light reflected from the external object may be introduced into the light sensor 750 through the second display area 730b, the second region 770b, the air layer 760, and at least one layer coupled thereto.

According to an embodiment, the first region 770a of the flexible layer 770 may include a plurality of holes 771, and the second region 770b of the flexible layer 770 may not include such holes. When the second region 770b is not include holes unlike the first region 770a, the second region 770b may have a substantially uniform light transmittance throughout the same, which may prevent the performance deterioration of the light sensor 750.

According to an embodiment, by the media coupled to the rear face of the display 730, a sixth interface 706 between the first display region 730a and the flexible layer 770, a seventh interface 707 between the flexible layer 770 and the second layer 780, and an eighth interface 708 between the second layer 780 and the back cover 740 may be formed. The sixth interface 706 may include an e-interface 706e between the first display region 730a and the air in the holes 771 and an f-interface 706f between the first display region 730a and a region 772 other than the holes 771. The seventh interface 707 may include a g-interface 707a between the air in the holes 771 and the second layer 780 and an h-interface 707h between the region 772 other than the holes 771 and the second layer 780. In addition, according to the structure of FIG. 7, a ninth interface 708 between the second display region 730b and the flexible layer 770, a tenth interface between the flexible layer 770 and the second layer 780, an eleventh interface 711 between the second layer 780 and the air layer 760, a twelfth interface 712 between the air layer 760 and the third layer 790, and a thirteenth interface 713 between the third layer 790 and the light sensor 750 may be formed. The reflectivity of an interface 706a, 706b, 707a, 707b, 708, 709, 710, 711, 712, or 713 may be determined based on the refractive indexes of two media forming the interface.

According to an embodiment, when external light such as sunlight is incident on the display 730, some of the external light may be reflected, absorbed, or blocked by the first layer, and the remaining external light (e.g., light in the visible light band or light in the ultraviolet band) may pass through the display 730. Light passing through the display 730 may be reflected from the sixth interface 706 and the ninth interface 709. Light passing through the flexible layer 770 may be reflected from the eighth interface 708 and the eleventh interface 711. Light passing through the display 760 may be reflected from the twelfth interface 712, and light passing through the third layer 790 may be reflected from the thirteenth interface 713.

According to an embodiment, light passing through the display 730 may be reflected from third medium layers 7003 including the sixth interface 706, the seventh interface 707, and the eighth interface 708, and reflected light having a first light amount may be introduced into the first display region 730a. In addition, light passing through the display 730 may be reflected from fourth medium layers 7004 including the ninth interface 709, the tenth interface 710, the eleventh interface 711, the twelfth interface 712, and the thirteenth interface 713, and reflected light having a fourth light amount may be introduced into the second display region 730b.

According to an embodiment, in comparison with the electronic device 600 of FIG. 6, the electronic device 700 of FIG. 7 may have a structure in which the flexible layer 770 extends to the second display region 730b and the second layer 780 or the third layer 790 including an anti-reflection material is added. Due to this, the total reflectivity in the third medium layers 7003 including the sixth interface 706, the seventh interface 707, and the eighth interface 708, and the total reflectivity in the fourth medium layers 7004 including the ninth interface 709, the tenth interface 710, the eleventh interface 711, the twelfth interface 712, and the thirteenth interface 713 may be substantially the same. The total reflectivity of the third medium layers 7003 may be defined as a ratio of the amount of light reflected from the display 730 to the amount of light incident on the sixth interface 7006 through the display 730. The total reflectivity of the fourth medium layers 7004 may be defined as a ratio of the amount of light reflected from the display 730 to the amount of light incident on the ninth interface 7009 through the display 730. When the total reflectivity of the third medium layers 7003 and the total reflectance of the fourth medium layers 7004 are substantially the same, it may mean that the difference between the total reflectivities does not exceed a set threshold.

According to an embodiment, when the third light amount reflected from the third medium layers 7003 and the fourth light amount reflected from the fourth medium layers 7004 may be substantially the same, and the luminance change of the first display region 730a and the luminance change of the second display region 730b, which are caused by the electrical influence of reflected light, may be substantially constant. Accordingly, since the display 730 has a substantially evenly reduced luminance over the entire region thereof, it is possible to improve image quality compared to the display 630 of FIG. 6. When the third light amount and the fourth light amount are substantially the same, it may mean that the difference between the third light amount and the fourth light amount does not exceed a set threshold.

According to some embodiments, the third layer 790 may be designed as a polarization layer and/or a phase retardation layer instead of the anti-reflection material. For example, the third layer 790 may include a polarization layer and a phase retardation layer disposed under the polarization layer. In another example, the third layer 790 may include a phase retardation layer and a phase retardation layer disposed under the polarization layer. According to some embodiments, the third layer may be formed as a single layer (e.g., a circularly polarized layer) in which a polarization layer and a phase retardation layer are combined.

According to some embodiments, the third layer 790 may further include a polarization layer and/or a phase retardation layer. For example, the third layer 790 may include a polarization layer and an anti-reflection material layer (hereinafter, referred to as an anti-reflection layer) disposed on or under the polarization layer. In another example, the third layer 790 may include a phase retardation layer and an anti-reflection layer disposed on or under the polarization layer. In another example, the third layer 790 may include a polarization layer, a phase retardation layer disposed under the polarization layer, and an anti-reflection layer disposed on the polarization layer, under the phase retardation layer, or between the polarization layer and the phase retardation layer. In another example, the third layer 790 may include a phase retardation layer, a polarization layer disposed under the phase retardation layer, and an anti-reflection layer disposed on the phase retardation layer, under the polarization layer, or between the phase retardation layer and the polarization layer. According to some embodiments, the third layer 790 may be formed as a single layer in which a polarization layer, a phase retardation layer, and an anti-reflection layer are combined.

According to an embodiment, when unpolarized light such as sunlight enters the display 730, the unpolarized light may pass through a polarization layer (e.g., the polarization layer 333 in FIG. 3) of the display 730 to be changed into linearly polarized light, this linearly polarized light passes through the phase retardation layer 332 to be changed to circularly polarized light, and this circularly polarized light may be incident on the third layer 790. According to an embodiment, the third layer 790 including the polarization layer and/or the phase retardation layer may reduce or block the circularly polarized light, which is reflected from the light sensor 750 and exits toward the display 730. When the reflected light, which is reflected from the light sensor 750 and exits toward the display 730, is reduced by the third layer 790, the third amount of light reflected from the third medium layers 7004 and introduced into the first display region 730a and the fourth light amount reflected from the fourth medium layers 7004 and introduced into the second display region 730b may be substantially the same. When the third light amount and the fourth light amount become substantially the same, the luminance change of the first display region 730a and the luminance change of the second display region 730b, which are caused by the electrical influence of reflected light, may be substantially the same. Due to the electrical influence of the reflected light, the display 730 has a substantially evenly reduced luminance over the entire region, and thus, when external light such as sunlight is incident, it is possible to ensure the image quality of the display 730.

According to some embodiments, the anti-reflection material layer may be defined as a higher concept including a polarization layer and/or a phase retardation layer.

In some embodiments, by including a layer of an anti-reflective material filling the hole 741 of the back cover 740 in place of or in addition to the third layer 790, the luminance change of the first display area 730a and the luminance change of the second display area 730b, which are caused due to the electrical influence of the reflected light, may be made constant.

Referring to FIG. 4, according to some embodiments, at least one face of the semiconductor layer 424 may be coated with a light-blocking material so as to suppress the luminance decrease of the display panel 331 caused by external light. According to an embodiment, when the rear face or the side face of the semiconductor layer 424 is coated with a light-blocking material, the luminance change of the first display area 730a and the luminance change of the second display area 730, which are caused due to the electrical influence of reflected light, may be made constant.

According to an embodiment of the disclosure, an electronic device 700 may include: a transparent layer 310; a display panel 331 disposed under the transparent layer 310, and including a pixel layer 410 including a plurality of pixels configured to output light in a visible light band for displaying a content through the transparent layer 310, and a substrate layer 420 disposed under the pixel layer 410 and including a plurality of switches capable of driving the plurality of pixels; a biometric sensor 750 disposed under at least part of the display panel 331, the biometric sensor 750 being configured to acquire biometric information using at least some of reflected light obtained when at least some of light output through at least some of the plurality of pixels is reflected from an external object; and a coating (e.g., the first layer 320 in FIG. 3) configured to reflect external light in an infrared band, transmitted to the substrate layer 420, and to transmit light in the visible light band. The coating 320 may be formed between the transparent layer 310 and the display panel 331.

According to an embodiment of the disclosure, the electronic device 700 may further include a light-blocking layer 740 disposed along the rear face of the display panel 331, and the light-blocking layer 740 may include a hole 741 aligned with the biometric sensor.

According to an embodiment of the disclosure, the electronic device 700 may further include a flexible transparent layer 770 disposed between the display panel 331 and the light-blocking layer 740.

According to an embodiment of the disclosure, the flexible transparent layer 770 may include a plurality of holes 771 formed in a portion that is not aligned with the hole 741 in the light-blocking layer 740.

According to an embodiment of the disclosure, the electronic device 700 may further include an anti-reflection layer 790 disposed between the flexible transparent layer 770 and the light-blocking layer 740 and configured to prevent reflection of external light.

According to an embodiment of the disclosure, the electronic device 700 may further include an anti-reflection layer 790 disposed between the hole 741 in the light-blocking layer 740 and the biometric sensor 750 and configured to prevent reflection of external light.

According to an embodiment of the disclosure, the anti-reflection member 780 may include at least one of a polarization layer and a phase retardation layer.

According to an embodiment of the disclosure, the transparent layer 310 may include a material for reflecting, absorbing, or blocking light in the ultraviolet band.

According to an embodiment of the disclosure, the display panel 331 may be an active matrix organic light-emitting diodes (AMOLED) panel.

According to an embodiment, the biometric sensor 750 may be a fingerprint sensor.

According to an embodiment of the disclosure, the electronic device 700 may display a home button through a portion of the display panel 331 aligned with the fingerprint sensor.

According to an embodiment of the disclosure, an electronic device 700 may include: a transparent layer 310; a display panel 331 disposed under the transparent layer 310, and including a plurality of pixels configured to output light in a visible light band for displaying a content through the transparent layer 310; a biometric sensor 750 disposed under at least part of the display panel 331 and configured to acquire biometric information using at least some of reflected light obtained when at least some of light output through at least some of the plurality of pixels is reflected from an external object; and an anti-reflection member configured to prevent reflection of external light introduced through the transparent layer 310 and the display panel 331. The anti-reflection member may be disposed between the display panel and the biometric sensor.

According to an embodiment of the disclosure, the electronic device 700 may further include anti-reflection coating, and the anti-reflection coating 790 may be formed on at least a portion of the biometric sensor 750.

According to an embodiment of the disclosure, the anti-reflection member 780 may be a film or may include a material coated on at least one layer between the display panel 331 and the biometric sensor 750.

According to an embodiment of the disclosure, the anti-reflection member 780 may include at least one of a polarization layer and a phase retardation layer formed on at least a portion of the biometric sensor 750.

According to an embodiment of the disclosure, the electronic device 700 may further include a light-blocking layer 740 disposed along the rear face of the display panel 331, and the light-blocking layer 740 may include a hole 741 aligned with the biometric sensor 750.

According to an embodiment of the disclosure, the electronic device 700 may further include a flexible transparent layer 770 disposed between the display panel 331 and the light-blocking layer 740.

According to an embodiment of the disclosure, the flexible transparent layer 770 may include a plurality of holes 771 formed in a portion that is not aligned with the hole 741 in the light-blocking layer 740.

According to an embodiment of the disclosure, the electronic device 700 may further include an anti-reflection layer 780 disposed between the flexible transparent layer 770 and the light-blocking layer 740.

According to an embodiment of the disclosure, the electronic device 700 may further include a layer 320 disposed between the transparent layer 310 and the display panel 331 and configured to reflect light in an infrared band.

The disclosure has been described above by way of exemplary embodiments. Those skilled in the art will appreciate that various modifications and changes may be made without departing from the essential spirit and scope of the disclosure. Therefore, the embodiments disclosed herein should be considered not from limitative viewpoints but from illustrative viewpoints. The scope of the disclosure should be determined not by the above description but by the appended claims, and all differences equivalent to the claims shall be construed as falling within the scope of the disclosure.

The invention claimed is:

1. An electronic device comprising:
a transparent layer;
a display panel disposed under the transparent layer, and including a pixel layer including a plurality of pixels configured to output light in a visible light band for displaying a content through the transparent layer, and a substrate layer disposed under the pixel layer and including a plurality of switches capable of driving the plurality of pixels;
a biometric sensor disposed under at least part of the display panel, the biometric sensor being configured to acquire biometric information using at least some of reflected light obtained when the at least some of light output through at least some of the plurality of pixels is reflected from an external object;
a coating configured to reflect external light in an infrared band, transmitted to the substrate layer, and to transmit light in the visible light band, wherein the coating is formed between the transparent layer and the display panel;
a light-blocking layer disposed along a rear face of the display panel, wherein the light-blocking layer includes a hole aligned with the biometric sensor; and
a flexible transparent layer disposed between the display panel and the light-blocking layer,
wherein the flexible transparent layer includes a plurality of holes formed in a portion that is not aligned with the hole in the light-blocking layer.

2. The electronic device of claim 1, further comprising:
an anti-reflection layer disposed between the flexible transparent layer and the light-blocking layer, the anti-reflection layer being configured to prevent reflection of the external light.

3. The electronic device of claim 1, further comprising:
an anti-reflection layer disposed between the hole in the light-blocking layer and the biometric sensor, the anti-reflection layer being configured to prevent reflection of the external light.

4. The electronic device of claim 3, wherein the anti-reflection layer includes an anti-reflection coating,
wherein the anti-reflection coating is formed on at least a portion of the biometric sensor.

5. The electronic device of claim 3, wherein the anti-reflection layer is a film or includes a material coated on at least one layer between the display panel and the biometric sensor.

6. The electronic device of claim 3, wherein the anti-reflection layer includes at least one of a polarization layer and a phase retardation layer.

7. The electronic device of claim 1, wherein the transparent layer includes a material that reflects, absorbs, or blocks light in an ultraviolet band.

8. The electronic device of claim 1, wherein the display panel is an active-matrix organic light-emitting diode (AMOLED) panel.

9. The electronic device of claim 1, wherein the biometric sensor is a fingerprint sensor.

10. The electronic device of claim 9, wherein a home button is displayed through a portion of the display panel aligned with the fingerprint sensor.

\* \* \* \* \*